United States Patent
Barr et al.

(10) Patent No.: US 7,624,383 B2
(45) Date of Patent: Nov. 24, 2009

(54) SYSTEM FOR AND METHOD OF IMPROVING DISCRETE EVENT SIMULATION USING VIRTUAL MACHINES

(75) Inventors: Rimon Barr, Ithaca, NY (US); Zygmunt J. Haas, Summit, NJ (US); Robbert Vanrenesse, Ithaca, NY (US)

(73) Assignee: Cornell University, Ithaca, NY (US)

( * ) Notice: Subject to any disclaimer, the term of this patent is extended or adjusted under 35 U.S.C. 154(b) by 844 days.

(21) Appl. No.: 11/116,733

(22) Filed: Apr. 28, 2005

(65) Prior Publication Data
US 2006/0036426 A1 Feb. 16, 2006

Related U.S. Application Data

(60) Provisional application No. 60/567,013, filed on Apr. 30, 2004.

(51) Int. Cl.
*G06F 9/44* (2006.01)
(52) U.S. Cl. ..................................... 717/135
(58) Field of Classification Search ................ 717/127, 717/130, 135
See application file for complete search history.

(56) References Cited

U.S. PATENT DOCUMENTS

| | | | |
|---|---|---|---|
| 5,247,651 A | | 9/1993 | Clarisse |
| 5,848,274 A * | 12/1998 | Hamby et al. ................ 717/153 |
| 6,314,558 B1 * | 11/2001 | Angel et al. .................. 717/118 |
| 6,697,876 B1 * | 2/2004 | van der Veen et al. ....... 719/313 |
| 6,760,903 B1 * | 7/2004 | Morshed et al. .............. 717/130 |
| 6,839,647 B2 * | 1/2005 | Volkov et al. ................ 702/119 |
| 6,968,540 B2 * | 11/2005 | Beck et al. ................... 717/130 |
| 7,266,476 B2 * | 9/2007 | Coburn et al. ................ 702/183 |
| 7,290,266 B2 * | 10/2007 | Gladstone et al. ........... 719/318 |
| 2002/0059054 A1 | 5/2002 | Bade et al. |
| 2002/0133325 A1 | 9/2002 | Hoare, II et al. |
| 2003/0182083 A1 | 9/2003 | Schwenke et al. |
| 2003/0212989 A1 | 11/2003 | Rokosz |
| 2004/0006584 A1 | 1/2004 | Vandeweerd |
| 2004/0128120 A1 | 7/2004 | Coburn et al. |
| 2005/0039186 A1 * | 2/2005 | Borkan ........................ 719/310 |
| 2005/0039187 A1 * | 2/2005 | Avakian et al. .............. 719/310 |
| 2005/0039190 A1 * | 2/2005 | Rees et al. ................... 719/316 |
| 2005/0055196 A1 | 3/2005 | Cohen et al. |
| 2005/0222689 A1 * | 10/2005 | Smith et al. ..................... 700/1 |

* cited by examiner

*Primary Examiner*—Wei Y Zhen
*Assistant Examiner*—Chih-Ching Chow
(74) *Attorney, Agent, or Firm*—Burns & Levinson, LLP; Jacob N. Erlich, Esq.; Kathy Chapman, Esq.

(57) ABSTRACT

The system and method of the present invention can allow the imbedding of simulation primitives within a conventional programming language in order to use the full capabilities of the conventional programming language and its compiler without modification in the programming of efficient, scalable simulators. The simulation primitives are designed to be preserved through the compilation process, thus allowing a rewriter to modify the compiler's byte code output without accessing the source code. Also, since the rewriter output is a set of class files and a kernel can be written in the conventional programming language, and the system and method of the present invention can execute within a conventional virtual machine associated with the conventional programming language.

18 Claims, 11 Drawing Sheets linear lookup     flat binning     hierarchical binning

SIMULATOR STACK

SYSTEM FOR AND METHOD OF IMPROVING DISCRETE EVENT SIMULATION USING VIRTUAL MACHINES

CROSS REFERENCE TO RELATED APPLICATIONS

The present application claims priority to U.S. Provisional Application No. 60/567,013 filed Apr. 30, 2004, entitled SYSTEM FOR AND METHOD OF IMPROVING DISCRETE EVENT SIMULATION USING VIRTUAL MACHINES which is incorporated herein in its entirety by reference.

STATEMENT REGARDING FEDERALLY SPONSORED RESEARCH OR DEVELOPMENT

The government may have certain rights to aspects of the present invention, pursuant to research funding under U.S. Air Force grants N00014-00-1-0564 and F49620-02-1-0233.

BACKGROUND OF THE INVENTION

Discrete event simulators are important scientific tools and their efficient design and execution is the subject of much research. From physics to biology, from weather forecasting to predicting the performance of a new processor design, researchers in many avenues of science increasingly depend on software simulations to model various realistic phenomena or hypothetical scenarios that often cannot be satisfactorily expressed analytically nor easily reproduced and observed empirically. Instead, simulation models are derived and then encoded as discrete event-driven programs: events are time-stamped messages processed in their temporal order as the simulator progresses through simulated time; event processing involves updating the simulation program state according to the given model and possibly scheduling more events in the future.

Recent research focused on networking and distributed systems communities on wireless ad hoc networks has fundamentally depended on simulation. Simulating an ad hoc network, or any other phenomenon, requires an accurate computational model that is nevertheless efficient. An objective of such research is to develop a sufficiently abstract representation of the state and of the state changes that can nonetheless produce meaningful, reliable results. For example, simulation time can often be discretized to produce discrete event simulations, which can be readily encoded as event-driven programs. Events are time-stamped messages, processed in their temporal order. Processing an event involves updating the simulation state according to the given model, and potentially scheduling more events in the future.

Simulation systems researchers have built many types of conservatively parallel and aggressively optimistic kernels and libraries, while the languages community has designed numerous simulation languages that codify event causality and execution semantics and simulation state constraints.

Some simulation systems use kernels, including systems such as the seminal TIMEWARP™ OS (See Johnson, et al., "Validation of wireless and mobile network models and simulation", *Proceedings of the DARPA/NIST Workshop on Validation of Large-Scale Network Models and Simulation*, May 1990), that transparently create convenient simulation time abstractions. By mimicking the system call interface of a conventional operating system, a kernel can execute simulations comprised of standard, unmodified programs. Further, since the kernel controls process scheduling, inter-process communication and the system clock, the kernel can run its applications in simulation time and can enforce process boundaries.

Some simulation systems use simulation libraries to combine individual processes to eliminate process context-switching and marshalling overheads required for event dispatch. In this case, message passing and scheduling, formerly kernel functions, must be explicitly programmed in user-space. In essence, the kernel and its applications are merged into a single monolithic program that contains both the simulation model as well as its own execution engine. This monolithic simulation program can be complex and not easily amenable to transparent parallelization and function distribution.

Some simulation programs are written in programming languages that are specifically written to accommodate simulations, such as SIMULA and PARSEC. These languages are designed to simplify simulation development and to explicitly enforce the correctness of monolithic simulation programs. Simulation languages often introduce execution semantics that transparently allow for parallel and speculative execution, without any program modification. Such languages often also introduce handy constructs, such as messages and entities, that can be used to partition the application state. Constraints on simulation state and on event causality are statically enforced by the compiler, and they also permit important static and dynamic optimizations. However, despite these advantages, simulation languages can suffer from specialization relative to general-purpose computing languages, such as C, JAVA®, LISP, etc. While simulation languages offer handy simulation-oriented features, they usually lack features such as type safety, reflection, and garbage collection, as well as portability. They can also lag in terms of general-purpose optimizations and implementation efficiency.

Each of these three fundamental approaches to simulation construction (i.e., kernel-based, library-based, and language-based) trades off one of three desirable properties—standardization, efficiency or transparency—where:

standardization means writing simulations in a conventional, popular programming language, as opposed to a domain-specific language designed explicitly for simulation;

efficiency denotes optimizing the simulation program statically and dynamically by considering simulation state and event causality constraints in addition to general-purpose optimizations, creating a simulation engine that compares favorably with existing, highly optimized systems both in terms of simulation throughput and memory consumption, and, possibly distributing the simulation and executing it in parallel or speculatively to improve performance; and transparency implies the separation of efficiency from correctness; that correct simulation programs can be automatically transformed to run efficiently without the insertion of simulation-specific library calls or other program modifications. Correctness is an assumed precondition that simulation programs must compute valid and useful results, regardless of how they are constructed.

With respect to simulating communication networks, even though a number of parallel discrete event simulation environments can scale beyond $10^4$ nodes, slow sequential simulators remain the norm. In particular, most published ad hoc network results are based on simulations of a limited number of nodes (usually only around 200 nodes), for a short duration (frequently just 90 seconds), and over a limited field. Larger simulations usually compromise on simulation detail or restrict node mobility.

Therefore, what is needed is a simulation system that does not involve creation of a new simulation language, nor a simulation library, nor a new system kernel or language runtime for simulation. What is needed is a simulation system that focuses on maximizing sequential simulation performance as well as effective distribution and parallelism.

SUMMARY OF THE INVENTION

The present invention provides a new approach for constructing simulators that leverages virtual machines and thus combines the advantages of the traditional systems-based and language-based approaches to simulator construction. In particular, the system and method of the present invention execute discrete event simulations by embedding simulation time semantics directly into the execution model of a chosen conventional language.

The system and method of the present invention can allow the imbedding of simulation primitives within the chosen conventional language in order to use the full capabilities of the chosen conventional language and its compiler without modification in the programming of efficient, scalable simulators. The simulation primitives are designed to be preserved through the compilation process, thus allowing a code rewriter to operate at the byte code level without source-code access. Also, since the rewriter output is a set of class files and the kernel can be written in the chosen conventional language, the system and method of the present invention can execute within a conventional virtual machine.

The system and method of the present invention augment the chosen conventional language by providing for entities which encapsulate objects. The programmer can create a simulation program in the chosen conventional language. Either manually or automatically, objects can be partitioned into entities. The compiler can transform the simulation program into byte code which can be loaded into a conventional virtual machine that is usually related to the chosen conventional language. During loading, a rewriter, which can be a dynamic class loader, can intercept class load requests and verify and modify the requested classes to incorporate the embedded simulation time operations in order to take advantage of cross-entity simulation semantics. The semantics of the chosen conventional language are maintained within each entity. In the illustrative embodiment, each object belongs to one entity, and objects do not communicate across entity boundaries. The conventional virtual machine can execute the byte code which, after being rewritten, interacts with the kernel that, for example, maintains the simulation time of each entity, ensures proper synchronization, implements efficient checkpointing or roll-back, and, with the conventional virtual machine, balances load on behalf of the executing simulation program. Message passing is initiated by the virtual machine which, when coupled with the simulation time kernel, passes messages between entities.

In the system and method of the present invention, simulation programs need not be written in a domain-specific language invented specifically for writing simulations, nor need they be littered with special-purpose system calls and call-backs to support runtime simulation functionality. Instead, the system and method of the present invention transparently introduce simulation time execution semantics to simulation programs written in the chosen conventional language, where the simulation programs are executed over a conventional virtual machine. In other words, the system and method of the present invention can convert a conventional virtual machine into a simulation virtual machine. Virtual machine-based simulation can provide the transparency of the kernel-based approach with the performance of a library-based approach, using language-based techniques, but within a conventional programming language.

In normal operation, a simulation program is compiled, then dynamically rewritten as it is loaded, and finally executed by the conventional virtual machine with support from the kernel. In the illustrative embodiment, the compiler and runtime components of the system of the present invention can be any standard object-oriented compiler, such as, for example, a JAVA® compiler, and its associated virtual machine. Simulation time execution semantics are introduced by the rewriter and simulation time kernel. The rewriter modifies programs written in the chosen conventional language by embedding simulation time semantics into the compiled classes of a simulation program. The conventional virtual machine, in conjunction with the kernel, runs the program in simulation time, not advancing the application clock to the next discrete time point until all processing for the current simulation time has been completed. The system and method of the present invention process simulation programs in their simulation-temporal order, until all queued events are exhausted or until a pre-determined ending time is reached, whichever comes first. The simulation program could be modeling anything from a wireless network to a peer-to-peer application to a new processor design.

The system and method of the present invention can also provide a framework for optimizing simulation runtimes. In an exemplary embodiment described below, the practicality of the present inventive framework is illustrated by applying it to the construction of a scalable wireless ad hoc network simulator. The network simulator described is capable of simulating million-node wireless networks.

For a better understanding of the present invention, together with other and further objects thereof, reference is made to the accompanying drawings and detailed description. The scope of the present invention is pointed out in the appended claims.

BRIEF DESCRIPTION OF THE FIGURES OF THE DRAWING

For a better understanding of the present invention, reference is made to the accompanying drawing and detailed description, wherein.

DETAILED DESCRIPTION OF THE INVENTION

The present invention is now described more fully hereinafter with reference to the accompanying drawings, in which the illustrative embodiment of the present invention is shown. The following configuration description is presented for illustrative purposes only. Any computer configuration satisfying the speed and interface requirements herein described may be suitable for implementing the system of the present invention. The present invention provides a simulation data processing system, a method and a computer program product for running discrete event simulations both efficiently and transparently using standard systems language and runtime.

Figure 1A:
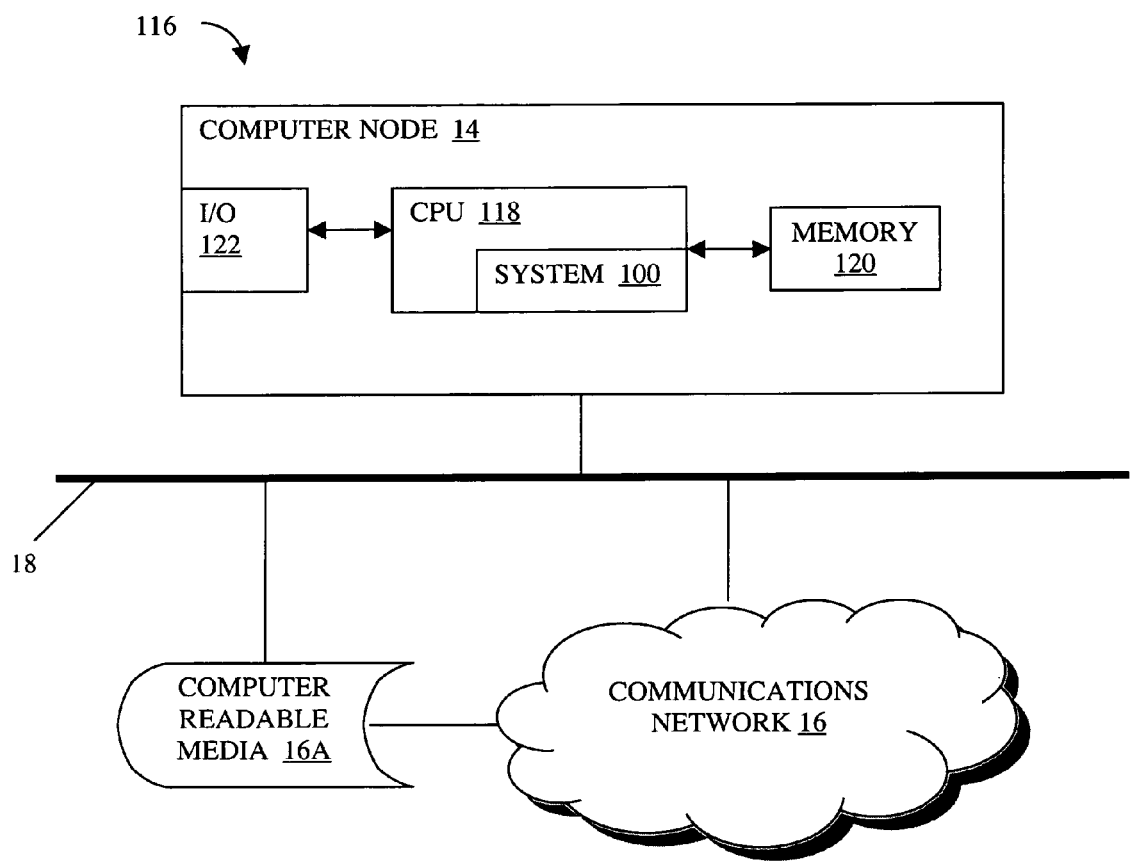
FIG. 1A is a schematic block diagram of the environment of the system of the present invention.

With reference to FIG. 1A, environment 116 in which system 100 executes can include, but is not limited to, Central Processing Unit (CPU) 118, Input/Output (I/O) 122 and memory 120. CPU 118 is typically in the form of a general data processor, such as those commonly found in personal computing devices, but may also be a specialized computing processor designed for a more specific task. Memory 120 can store software, data, and intermediate processes, and an I/O device 122 can provide user access. Additionally, system 100 may be downloaded from communications network 16 or from at least one computer readable medium 16A through electronic interface 18. Common forms of at least one computer-readable medium 16A can include, for example, but are not limited to, a floppy disk, a flexible disk, a hard disk, magnetic tape, or any other magnetic medium, a CDROM or any other optical medium, punched cards, paper tape, or any other physical medium with patterns of holes, a RAM, a PROM, and EPROM, a FLASH-EPROM, or any other memory chip or cartridge, or any other medium from which a computer can read. Control and data information can be electronically executed and stored on computer-readable medium 16A. System 100 can be implemented to execute on computer node 14 in communications network 16.

Figure 1B:
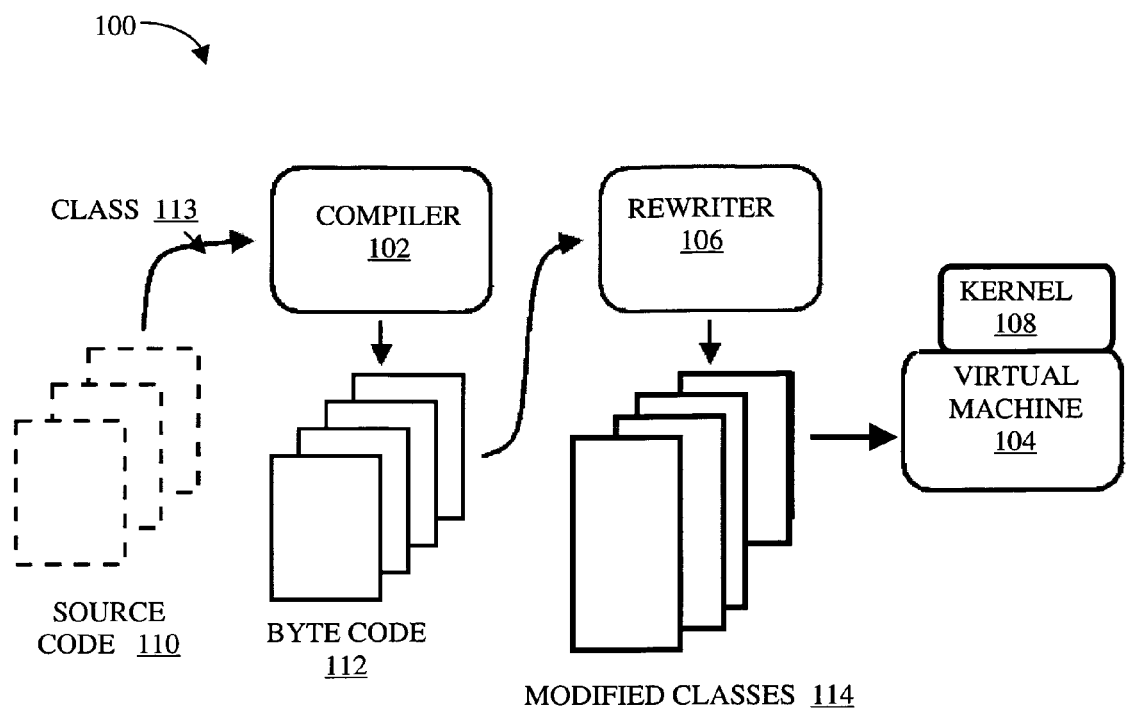
FIG. 1B is a data and execution flow diagram of the components of the system of the present invention.

Referring now to FIG. 1B, system 100 can include, but is not limited to, four components: compiler 102, language runtime or virtual machine 104, rewriter 106, and kernel 108 (also referred to as simulation kernel 108). Compiler 102 and virtual machine 104 can be any standard compiler and virtual machine for a conventional object-oriented language, such as, for example, the JAVA® 2 V1.4 implementation (see J. Gosling, et al., *The Java Language Specification*, Addison-Wesley 1996, incorporated herein by reference), both the javac and jikes compilers, and the SUN MICROSYSTEMS® HotSpot JAVA® Virtual Machine V1.4.1, which can execute within operating system platforms such as, for example, LINUX® and WINDOWS®. Virtual machine 104 can be, for example, the JAVA® Virtual Machine, which is a stack-based JAVA® byte code execution engine. (See T. Lindholm and F. Yellin, *The Java Virtual Machine Specification*, Addison-Wesley 1996, incorporated herein by reference.) Any language that has the properties and capabilities of JAVA®, in particular object-orientation, object reflection, serialization, cloning, intermediate byte code representation, and optionally, type-safety, and garbage collection, can be used to implement system 100. Other suitable languages can include, but are not limited to, Smalltalk, C#, Ruby, and Python.

Figure 2:
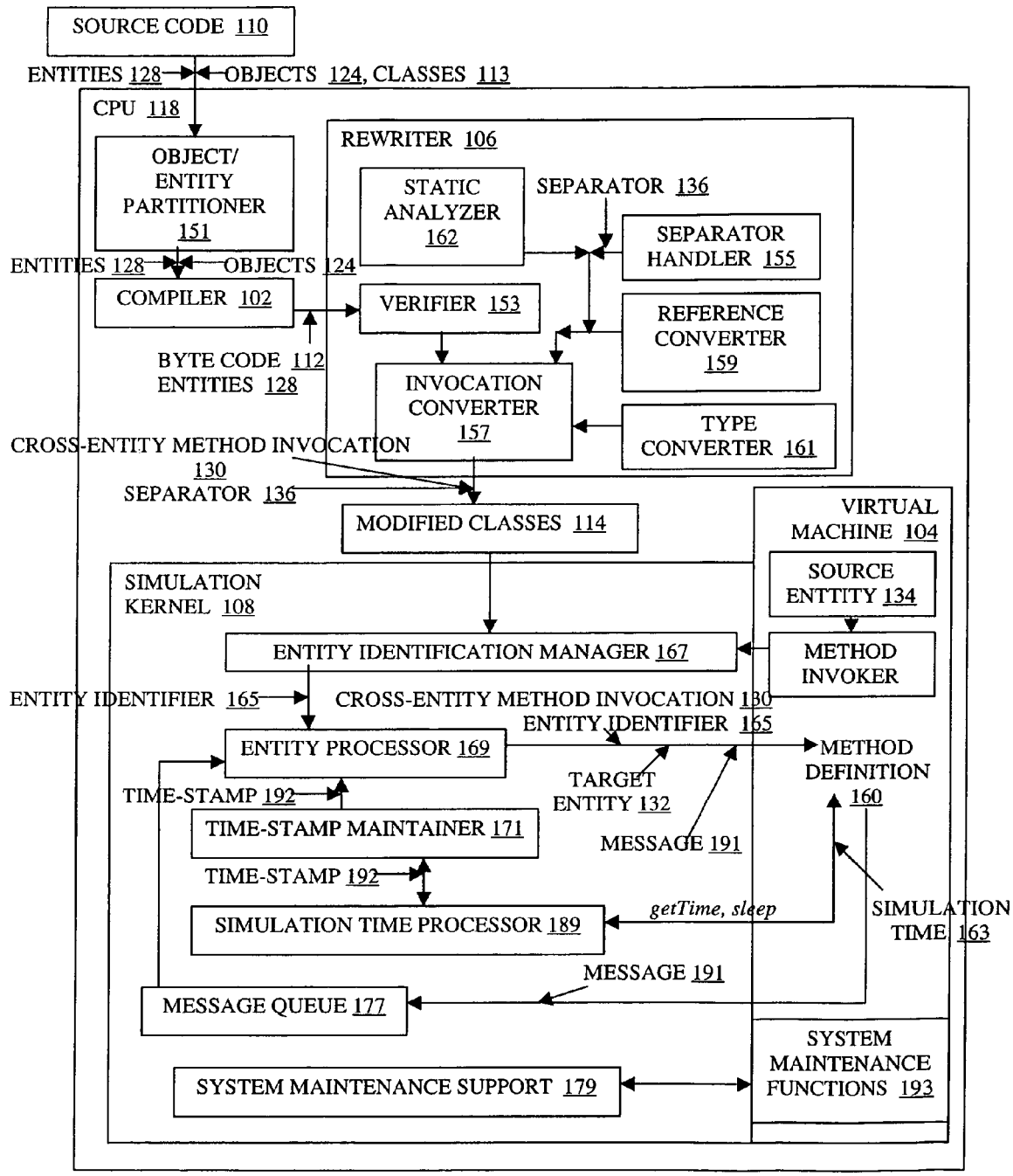
FIG. 2 is a schematic block diagram of subcomponents and data flow among the subcomponents of the system of the present invention.

Continuing to refer primarily to FIG. 1B, simulation time execution semantics are introduced by the two remaining system components, rewriter 106 and kernel 108. Rewriter 106 can be a dynamic class loader that can intercept all class load requests and verify and modify the requested classes. Modified classes 114 can incorporate embedded "simulation time" operations, and can otherwise preserve the existing program logic. Program transformations can occur at load time so that they may not incur rewriting overhead during execution. Rewriter 106 does not modify source code 110, but instead modifies byte code 112, such that it can be run in simulation time 163 (FIG. 2). Rewriter 106 can convert byte code 112 to implement simulation time execution semantics by creating modified classes 114 that can contain special instructions, such as the sleep instruction, the need for which is now described. Under a conventional execution model, referred to hereinafter as actual time execution, the passing of time is not explicitly linked to the progress of the program. In other words, a system clock advances regardless of how many byte code instructions are processed. Also, a program can advance at a variable rate, since it depends not only on processor speed, but also on other unpredictable things, such as interrupts and program inputs. Unlike actual time execution systems, wherein the rate of program progress is made dependent on the passing of time, in system 100 the progress of time depends upon the progress of the program. An application clock representing simulation time 163 (FIG. 2) does not advance to the next discrete time point until all processing for the current simulation time has been completed. Under simulation time execution, individual program byte code 112 instructions are processed sequentially, following standard language control flow semantics. However, the simulation time clock will remain unchanged. Program code can only advance simulation time 163 via the sleep(n) system call. In essence, every instruction takes zero simulation time 163 to process except for sleep, which advances the simulation clock forward by exactly n simulated time quanta, or ticks. In other words, the sleep function advances time under simulation time execution, just as it does under actual time execution. The primary difference is that, under simulation time execution, all other program instructions except the sleep function do not have the side-effect of allowing time to pass as they are processed.

Continuing to still further refer primarily to FIG. 1B, at runtime, modified classes 114 can interact closely with kernel 108 through various injected or modified operations. Kernel 108 can be written in an object-oriented language such as, for example, JAVA®, and it is responsible for all the runtime aspects of the simulation time abstraction. For example, kernel 108 can maintain the simulation time 163 (FIG. 2) of each entity 128 (FIG. 3A), ensure proper synchronization, can implement efficient checkpointing or rollback, and can, in conjunction with virtual machine 104, balance load on behalf of a running simulation program. Kernel 108 can be implemented with a variety of concurrency and synchronization models. Kernel 108 can also integrate with external software components designed for high-performance parallel distributed programs and can leverage specialized hardware when available. In typical operation, program source code 110 is first compiled into byte code 112, then dynamically rewritten into modified classes 114 as it is loaded, and finally executed by virtual machine 104 with support from simulation kernel 108. These functions preferably occur within environment 116 (FIG. 1A). Virtual machine 104 in conjunction with kernel 108, process simulation programs in their simulation-temporal order, until all queued events are exhausted or until a pre-determined ending time is reached, whichever comes first. The simulation program could be modeling anything from a wireless network to a peer-to-peer application to a new processor design.

Referring now to FIG. 2, source code 110 having at least one object 124 and at least one entity 128 can be partitioned by object/entity partitioner 151 and provided to compiler 102 for conversion to byte code 112. When byte code 112 is loaded, rewriter 106 can prepare at least one modified class 114 for execution by virtual machine 104 and kernel 108. Specifically, rewriter 106 can perform a variety of actions with respect to at least one modified class 114. Rewriter 106 can transform system 100 instructions embedded within the compiled simulation program into code with the appropriate simulation time semantics. The result is a partitioned application in which entities 128 encapsulate private state, reference other entities 128 only through separators 136, and communicate with one another via kernel 108. Rewriter 106 can be designed as a multi-pass visitor over the class file structure, traversing and possibly modifying the class 113, its fields and methods, and their instructions, based on the set of rules summarized below. Rewriter 106 can include, but is not limited to, sub-programs such as, for example, static analyzer 162, verifier 153, separator handler 155, invocation converter 157, reference converter 159, and type converter 161. Rewriter 106 can be implemented as a dynamic class loader. In the illustrative embodiment, rewriter 106 uses a Byte-Code Engineering Library to automatically modify the simulation program byte code 112 as it is loaded by system 100 into virtual machine 104. (See M. Dahm, *Byte code engineering with the BCEL API*, Technical Report B-17-98, Freie Universitat Berlin, Institut fur Informatik, April 2001, incorporated herein by reference.) Rewriter 106 can ultimately prepare at least one modified class 114 for execution by virtual machine 104 in conjunction with kernel 108.

Continuing to refer to FIG. 2, verifier 153 can perform byte code checks, in addition to the chosen conventional language byte code checks, that are specific to simulations. Specifically, verifier 153 can ensure that all classes 113 that are targeted as entities 128 conform to entity restrictions such as, for example, in the case of JAVA®, that the fields of entity 128 are non-public and non-static, and that all public methods are concrete and return void. These types of restrictions can ensure that the state of entity 128 is restricted to its instance, and can also allow entity methods to be invoked without continuation, as per simulation time semantics.

Figure 3A:
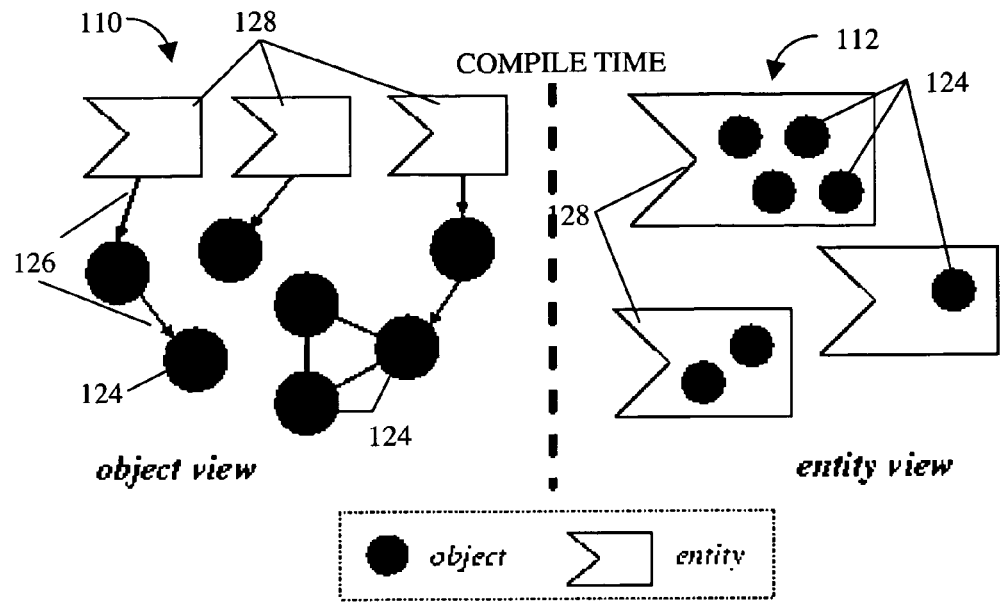
FIGS. 3A, 3B are state diagrams of compile time and run time simulation states illustrating the entity concept in accordance with the present invention.

Continuing to refer primarily to FIG. 2, partitioning the program's state can require, for example, that target entities 132 are not referenced directly by source entities 134 (FIG. 3A). Reference converter 159 can add separators 136 and a self-referencing separator field to each entity 128, and can add code to initialize the separator field using a unique reference provided by kernel 108 upon creation. Invocation converter 157 can convert entity field accesses into cross-entity method invocations 130. Invocation converter 157 can also replace cross-entity method invocations 130 with invocations to kernel 108. Invoking a method through kernel 108 can require parameters such as, for example, caller entity time (simulation time 163) provided by kernel 108, entity identifier 165 found using, for example, an automatically created and pre-initialized method reflection stub, the target entity 132 identified using its separator 136, which can be found by separator handler 155, for example, on the stack in place of a chosen conventional language object reference. Separator handler 155 can modify entity creations in classes 113 to replace an object reference with separator 136, for example, by placing separator 136 on the stack in place of the object reference. Type converter 161 can convert entity types in entities 128 to separators 136, for example, in field types, method parameter types, method return types, typed instructions, field accesses, array accesses, array creation, and type casting instructions. Type converter 161 can also convert static calls written using an Applications Programming Interface (API) associated with system 100 into equivalent implementations that invoke the functionality of kernel 108. Static analyzer 162 can identify open-world immutable objects and label them as timeless objects 138 (FIG. 4), which means that they may be passed by reference across entities 128, not by copy. Note that object 124 can be defined manually as a timeless object 138. Static analyzer 162 can also generate code to assist in efficient object checkpointing and remote entity invocation.

Continuing to still further refer to FIG. 2, after rewriting, simulation classes 113 may be executed over conventional virtual machine 104. During their execution, these rewritten programs can interact with kernel 108, which supports the simulation time semantics. Kernel 108 can include, but is not limited to, subprograms such as entity identification manager 167, entity processor 169, time-stamp maintainer 171, simulation time processor 189, message queue 177, and system maintenance support 179. Kernel 108, through, for example, entity processor 169, is responsible for scheduling and transmitting time-stamped messages 191 among entities 128 to, for example, target entity 132. Kernel 108 can provide unique identifiers, such as entity identifier 165, for each entity 128 created in system 100, which are used, for example, by the entity separator stubs during cross-entity method invocation 130, and which are stored in, for example, method definition 160, along with target entity 31, message 191, and simulation time 163. Kernel 108 can maintain through, for example, time-stamp maintainer 171, time-stamp 192, and kernel 108 can maintain through, for example, message queue 177, a message queue structure for every entity 128 in system 100. Kernel 108 is thus able to time-stamp outgoing invocation messages 191, and, through simulation time processor 189, is able to respond to program getTime requests. Kernel 108, through message queue 177 in conjunction with modified classes 114, can queue messages 191 on behalf of each entity 128, and can automatically advance entities 128 through simulation time 163, delivering messages 191 for program processing as appropriate. Kernel 108, through, for example, system maintenance support 179, can support various system maintenance functions such as, for example, entity garbage collection, load balancing and application monitoring.

Continuing to still further refer to FIG. 2, conventional virtual machine 104 can include subprograms such as, for example, method invoker 183 and system maintenance functions 193. These functional divisions are presented for illustrative purposes only. Any conventional virtual machine 104 associated with a conventional language that meets the requirements presented herein can interface with kernel 108 and support discrete event simulation. In the illustrative embodiment, dynamically created objects such as packets can traverse many different control paths within the simulator and can have highly variable lifetimes. The accounting for when to free unused packets can be handled entirely by a system maintenance function 193 such as a garbage collector. This use of garbage collection can simplify memory management, and can eliminate a common source of memory leaks that can accumulate over long simulation runs.

Figure 3B:
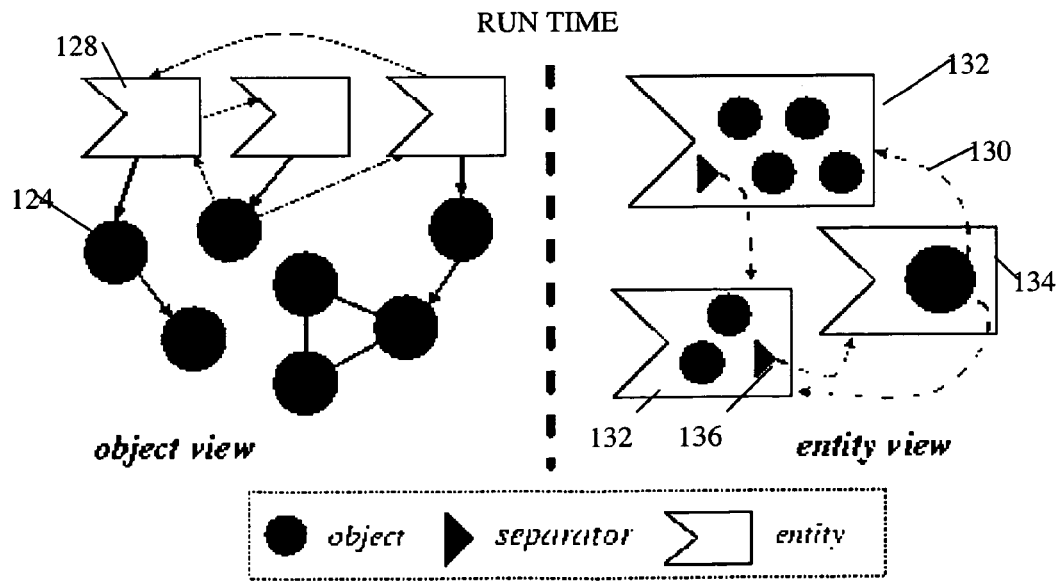

Referring now primarily to FIGS. 3A and 3B, source code 110 can include numerous classes 113 (FIG. 1B) that can collectively implement the program's logic, where classes 113 can contain individual objects 124. The state of the program can be contained within individual objects 124 during the execution of the program. Interactions among objects 124 are represented syntactically as object method invocations 126. System 100 (FIG. 1B) extends this traditional programming model by introducing simulation entities 128, defined syntactically as instances of classes 113 that implement an empty Entity interface (described below). System 100 can partition a simulation program into multiple entities 128 along reasonable application boundaries, which is akin to partitioning a program into separate classes 113. Simulation objects 124 can be logically contained within entities 128, where object containment within entity 128 is defined in terms of the reachability of object 124. The state of entity 128 is the combined state of all objects 124 reachable from it. Thus, although entities 128 are regular objects 124 within virtual machine 104 at runtime, they serve to logically encapsulate program objects 124. Entities 128 are components of a simulation and represent the granularity at which kernel 108 manages a running simulation.

Referring now primarily to FIG. 3A, each entity 128 has its own simulation time 163 (FIG. 2) and may progress through simulation time 163 independently. Thus, entity 128 cannot share its state with any other entity 128, otherwise there could be an inconsistency in the state of the simulation. In other words, in the illustrative embodiment, each (mutable) object 124 of the simulation is contained within exactly one entity 128. If source code 110 is written in a safe language, this constraint is sufficient to partition the simulation into a set of non-overlapping entities 128 and also prevents unmediated communication across entity boundaries. All instructions and operations within entity 128 follow the control flow and semantics of the chosen conventional language, entirely opaque to infrastructure of system 100. Specifically, object method invocations 126 can remain unchanged. Thus, in the illustrative embodiment, most of the entity code can be involved with encoding the logic of the simulation model and can be unrelated to the concept of simulation time 163 (FIG. 2). Class libraries that are part of the chosen conventional programming language can be available for use and can behave as expected. Functions that are specific to system 100, such as getTime and sleep, which return the current simulation time and advance it, respectively, can be used within source code 110 to implement a simulation program.

Figure 8:
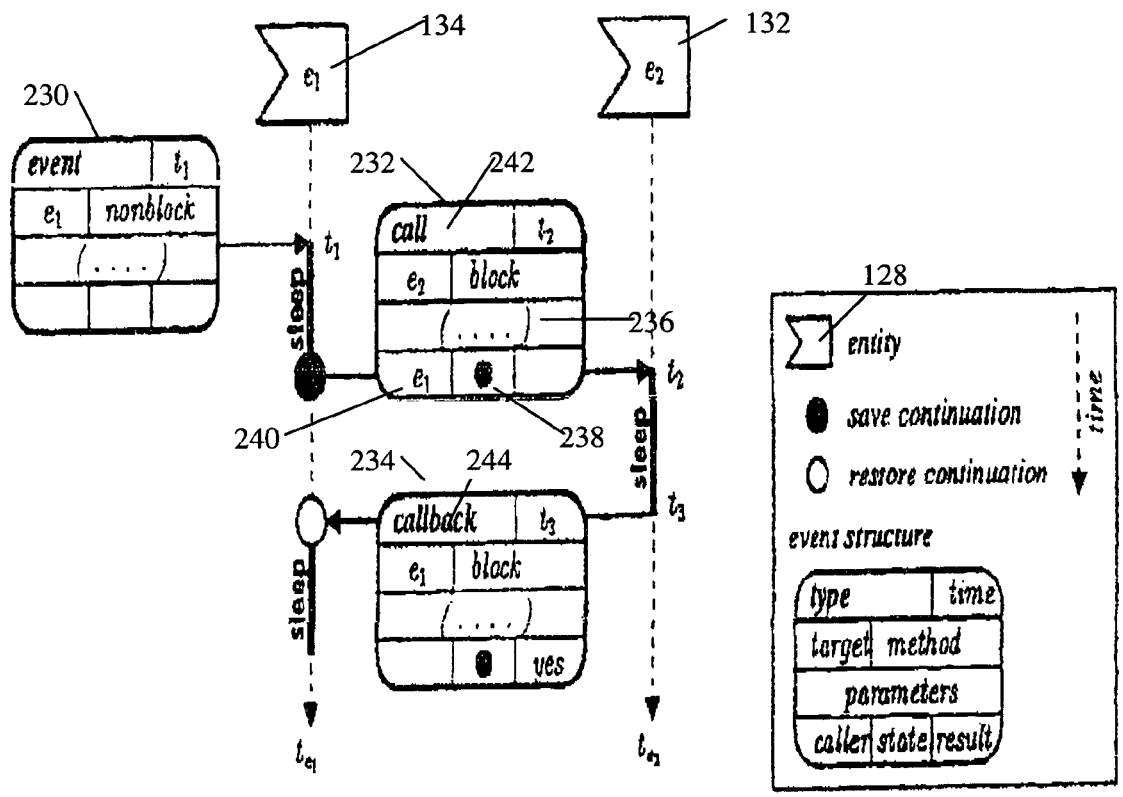
FIG. 8 is a schematic block diagram of the execution flow of blocking methods of the present invention.

Referring now primarily to FIG. 3B, in contrast, cross-entity method invocations 130 correspond to simulation events executed in simulation time 163 (FIG. 2). The execution semantics require that cross-entity method invocations 130 are non-blocking. They are queued at their point of invocation. Cross-entity method invocation 130 is actually performed on the callee (or target) entity 132 only when it reaches the same simulation time 163 as the calling (or source) entity 134. In other words, cross-entity method invocations 130 act as synchronization points in simulation time 163. Or, from a language-oriented perspective, an entity's method is like a co-routine, albeit scheduled in simulation time 163. This abstraction can eliminate the need for an explicit simulation event queue. Kernel 108 runs an event loop 246 (FIG. 9), which processes the simulation events. Kernel 108 invokes the appropriate method for each event de-queued in its simulation time 163 order and executes the event to completion without continuation (see FIGS. 9 and 10). Because of the simulation partitioning, cross-entity method invocation 130 can only occur via system 100 (FIG. 1B). This model of execution, known as the "concurrent object model", invokes a method for every message 191 (FIG. 2) received and executes it to completion. This is in contrast to a "process model" that is used, for example, in the Parsec language, wherein explicit send and receive operations are interspersed in the code. In the process model, each entity 128 must store a program-counter and a stack as part of its state 238 (FIG. 8). Message sending in system 100 is embedded in the language and does not require a simulation library or new language constructs. In certain embodiments, a transformation allows both process-oriented and event-oriented simulations to co-exist within system 100.

Continuing to refer to FIG. 3B, in order to invoke a method on target entity 132—to send it an event—source entity 134 must hold some kind of reference to target entity 132. All references to a given (mutable) object 124 must originate from within the same entity 128. References to entities 128 are free to originate from any entity 128, including from objects 124 within any entity 128. The rationale is that object references imply inclusion within the state of an entity 128, whereas entity references represent channels along which simulation events are transmitted. As a consequence, entities 128 do not nest.

Continuing to further refer primarily to FIG. 3B, the separation of entities 128 is reintroduced at runtime by transparently replacing all entity references within the simulation byte code 112 (FIG. 1B) with special objects called separators 136. Separator 136 can identify a particular target entity 132, but without referencing it directly. Rather, separator 136 can store a unique entity identifier 165 (FIG. 2) that is generated by kernel 108 (FIG. 2) for each simulation entity 128 during its initialization. Separators 136 can be held in local variables, stored in fields or objects 124 or passed as parameters to methods, just like the regular object references that they replace. Since the replacement can occur across the entire simulation byte code 112, it can remain type-safe. Separators 136, in effect, represent an application state-time boundary around each entity 128 at a fine granularity. Separators 136 can be convenient points to insert additional simulation functionality. Since entities 128 do not share any application state, each can progress through simulation time 163 (FIG. 2) independently between interactions. Thus, by tracking the simulation time 163 of each entity 128 individually, separators 136 can allow for concurrent execution. Each entity 128, $e_i$, can represent a tuple (state$_i$, time), and the state of the entire simulation at any given time is the union of the state of all its entities 128 at that time: state(t)=U(state$_i$, t). By adding entity checkpointing, the model can even support speculative execution. Furthermore, separators 136 also provide a convenient point for the distribution of entities 128 across multiple machines. In a distributed simulation, separators 136 can function as remote stubs and transparently maintain a convenient abstraction of a single system image. Separators 136 can transparently store and track the location of entities 128 as they migrate among machines in response to fluctuating processor, memory, and network loads.

Continuing to still further refer to FIG. 3B, system 100 (FIG. 1B) can be implemented by making use of concepts such as proxy entities, blocking events, and simulation time concurrency. With respect to proxy entities, in system 100, simulation events can be encoded as cross-entity method invocations 130, which can reduce the amount of source code required and can improve the source code's clarity without affecting runtime performance. In system 100, an event can automatically carry its context information: the point of dispatch (with line numbers, if source information is available), as well as the state of the source entity 134. These contexts can then be chained to form an event causality trace, the equivalent of a stack trace. The tight coupling of event dispatch and delivery in the form of a cross-entity method invocation 130 also has important performance implications. Tight event-loops, which can be determined only at runtime, can be dynamically optimized and inlined even across the kernel boundary between system 100 and the running simulation.

Referring now primarily to Table 1, an example of the use of system 100 (FIG. 1B) provided by a JAVA®-based language and virtual machine interface is shown. In the example shown, interaction with kernel 108 (FIG. 2) is via an API that is exposed at the language level through various interfaces, methods and fields comprising a JiSTAPI class listed partially in Table 1 and explained below. The remainder of the API will be explained as the corresponding concepts are introduced.

Table 1

```
    JiSTAPI.java
1   package jist.runtime:
2   class JiSTAPI {
3       interface Entity {}
4       long getTime ( );
5       void sleep(long ticks);
6       void end( );
7       void endAt(long time);
8       void run(int type, String name, String[] args, Object props);
9       void runAt(Runnable r, long time);
10      void setSimUnits(long ticks, String name);
11      interface Timeless {}
12      interface Proxiable {}
13      Object proxy(Object proxyTarget, Class proxyInterface);
14      class Continuation extends Error {}
15      Channel createChannel( );
16      interface CustomRewriter { JavaClass process(JavaClass jc1); }
17      void installRewrite(CustomRewriter rewrite);
18      interface Logger { void log(String s);)
19      void setLog(JistAPI.Logger logger);
20      void log(String s);
21      JiSTAPI.Entity THIS;
22      EntityRef ref(Entity e);
23   }
```

The entity interface tags a simulation object as an entity 128 (FIG. 3A), which means that invocations on this object follow simulation time semantics: method invocations become events that are queued for delivery at the simulation time 163 (FIG. 2) of source entity 134 (FIG. 3B) (e.g., jist.swans.mac.MacEntity in the example below). The Timeless interface explicitly tags a simulation object as a timeless object 138 (FIG. 4), meaning it will not be changed across simulation time 163 and thus need not be copied when transferred among entities 128. Immutable objects are implicitly tagged as timeless objects 138 (e.g., jist.swans.node.Message in the example below). The getTime call returns the current simulation time 163 of the source entity 134, which is the time of the current event being processed plus any additional sleep time. The sleep call advances the simulation time 163 of the source entity 134. The endAt call specifies when the simulation should end. The THIS self-referencing entity reference is analogous to a JAVA® this object self-reference. It refers to the entity 128 for which an event is currently being processed. The ref(Entity) call returns a separator stub of a given entity 128. Since statically detectable entity references are automatically converted into separator stubs by rewriter 106, ref (Entity) is included to deal with the instances when entity types might be created dynamically.

Referring now primarily to Table 2, the simulation primitives previously described can allow programmers to write simulation programs, including full wireless network simulators, such as, for example, the "hello world" program, which is a simulation with only a single entity 128 (FIG. 3A) that emits one message 191 (FIG. 2) at every simulation time-step.

TABLE 2

```
    hello.java
1   import jist.runtime.JistAPI;
2   class hello implements JistAPI.Entity {
3       public static void main(String[] args) {
4           System.out.print("start simulation");
5           hello h = new hello( );
6           h.myEvent( ) {
7       }
8       public void myEvent( ) {
9           JistAPI.sleep(1);
10          myEvent( );
11          System.out.print("hello world, t="+JistAPI.getTime( ));
12      }
13  }
```

In the program in Table 2, the hello class is an entity 128, since it implements the Entity interface (line 2). Entities 128 can be created (line 5) and their methods invoked (lines 6 and 10) just as any object 124 (FIG. 3A), such as a JAVA® object. Cross-entity method invocation 130 (FIG. 3B), however, happens in simulation time 163 (FIG. 2). This is most apparent on line 10, which is a seemingly infinite recursive call. In fact, if this program is executed within a convention virtual machine 104 (FIG. 1B) without the semantics of system 100 (FIG. 1B), the program in Table 2 would abort with a stack overflow at line 10. However, the semantics of system 100 schedules the invocation via the kernel 108 (FIG. 1B) and thus the call becomes non-blocking. Therefore, the myEvent method, when run under system 100 semantics, can advance simulation time 163 (FIG. 2) by one time step (line 9), then schedule a new event at that future time, and finally print a hello message with the entity simulation time (line 11). Instead of a stack overflow, the program runs in constant stack space and the output is:

```
simulation start
hello world, t = 1
hello world, t = 2
hello world, t = 3
etc.
```

Figure 4:
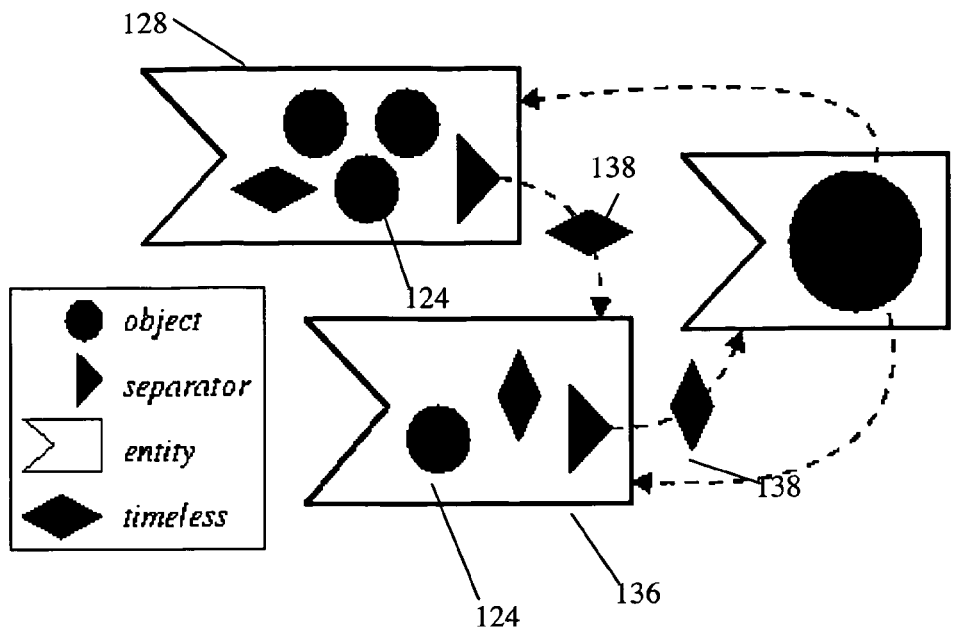
FIG. 4 is a state diagram illustrating the use of timeless objects.
Figure 5:
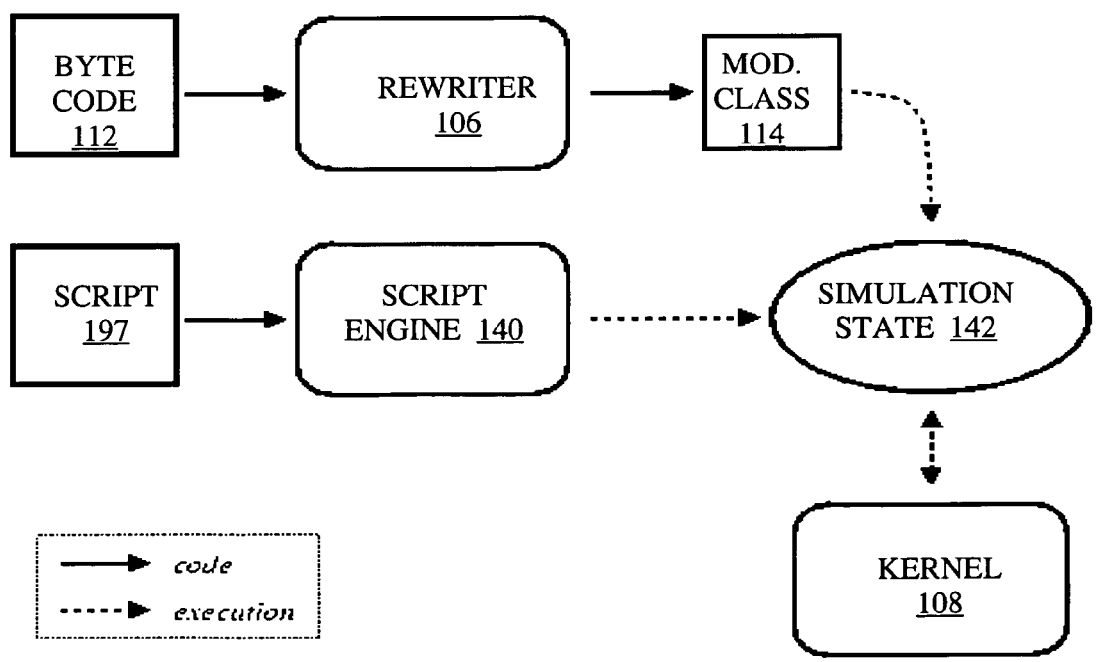
FIG. 5 is a data and execution flow diagram illustrating simulation system operation and optional script engine in accordance with the system of the present invention.

Referring now to FIGS. 4 and 5, performance-related extensions to system 100 (FIG. 1B), namely timeless objects 138 (FIG. 4) and reflection-based configuration, are presented. To implement these extensions, the byte code 112 (FIG. 5) is annotated, if necessary, and then high-level optimizations and cross-cutting transformations are performed by rewriter 106 (FIG. 5), akin to aspect-oriented programming. (See G. Kiczales, et al., Aspect-oriented programming, *Proceedings of the European Conference on Object-Oriented Programming*, 1241:220-242, 1997, incorporated herein by reference.) Referring now to FIG. 4, with respect to timeless objects 138, knowing that a value is temporally stable allows system 100 to safely pass it across entities 128 by reference, rather than by copy. System 100 may be able to statically infer that object 124 is transitively open-world immutable and automatically add a label designating it a timeless object 138. Zero-copy semantics can be explicitly requested by using the Timeless interface to tag an object, which implies that the tagged object will not be modified at any time after references to it escape an entity boundary. Thus, the addition of a single tag, or the automatic detection of the timeless property, affects all the events within the program that contain objects 124 of this type. The explicit tagging facility should be exercised with care, since individual entities 128 may progress at different rates through simulation time 163 (FIG. 2), and this can result in a temporal inconsistency within the simulation state 142 (FIG. 5). The timeless object 138 label is also useful for sharing state among entities to reduce simulation memory consumption. For example, network packets are defined to be timeless in the wireless network simulator described below, in order to prevent unnecessary duplication. Broadcasted network packets are therefore not copied for every recipient, nor are they copied in the various sender retransmit buffers. Similarly, object replicas can be safely shared across different instances of a simulated peer-to-peer application.

With respect to reflection-based configuration, and referring now to FIG. 5, an important consideration in the design of simulators is configurability and the ability to reuse the simulator for many different experiments. This generality can adversely affect performance. Configuration is usually supported either at the source-code level, via configuration files, or with scripting languages. Source-level configuration can entail the recompilation of the simulation program before each run with hard-coded simulation parameters and the linkage with a small driver program for simulation initialization. This approach to configuration is flexible and runs efficiently, because the compiler can perform constant propagation and other important optimizations on the generic simulation code to produce a specialized and efficient executable. However, it requires recompilation on each run. The use of configuration files eliminates the need for recompilation. The configuration is read and parsed by a generic driver program as it initializes the simulation. This option is not only brittle and limited to pre-defined configuration options, it eliminates opportunities for static compiler optimizations. A script-based configuration approach can include a scripting language interpreter that is backed by the compiled simulation runtime, so that script variables are linked to simulation values, and a script 197 can then be used to instantiate and initialize the various pre-defined simulation components. Unfortunately, the linkage between the compiled simulation components and the configuration scripts 197 can be difficult to establish and can clutter simulation source code causing inefficiency, and scripting can eliminate static optimization opportunities and static and dynamic type information passing across the compiled-interpreted interface. In contrast, if a dynamic language that supports reflection such as, for example, JAVA®, is used to program script 197, the access that script engine 140 has to the simulation state 142 is just as efficient and expressive as the compiled driver program. Script engine 140 can query and update simulation values by reflection for purposes of tracing, logging, and debugging, and can also dynamically pre-compile driver script directly to byte code 112 for efficient execution. Byte code 112 is compiled and optimized dynamically, as the simulation executes. In the illustrative embodiment described herein, JAVA®-based scripting is integrated with a BeanShell interpreter (http://www.beanshell.org). Other possible JAVA®-based interpreter engines can include, but are not limited to, Jython (Python), Rhino (JavaScript) and Jacl (Tcl).

Continuing to refer primarily to FIG. 5, entities 128 (FIG. 4) can encapsulate simulation state 142 and present an event-oriented interface using methods. However, methods also represent conventional invocations on objects 124 (FIG. 4). Thus, object method invocation 126 (FIG. 3A) and cross-entity method invocation 130 (FIG. 3B) have two different meanings. There can exist a clash of functionality between entity and object invocation semantics at the syntactic level. This can impose restrictions on the developer and can lead to awkward coding practices within entity classes 113 (FIG. 2). To have both kinds of methods coexist, proxy entities, which are interface-based entities that relay events onto their targets, can be provided. Proxies can be created via a proxy system call, which can accept a proxy target and one or more proxy interfaces. The proxy target can be one of three types: a regular object 124, a proxiable object, or an entity 128, as described below. The proxy interface can indicate which methods will be exposed and relayed. Objects 124 do not contain the machinery to receive events from kernel 108, so they are wrapped, along with any reachable objects 124, within a new entity 128. This results in the addition of a cross-entity method invocation 130 into the event delivery process which can be eliminated through the use of a proxiable object that implements a Proxiable interface. The effect of this tag is to introduce the additional machinery for receiving events from kernel 108 (FIG. 1B) and to eliminate the overhead of the additional cross-entity method invocation 130. An existing entity 128 can also be proxied. This can leave an event delivery path unchanged, but can serve an important function on the dispatch side. The result of the proxy call, in this and in all the previous cases, is a special separator that relays only the events of the specified proxy interface. Thus, events from a particular source are restricted, which is useful in larger simulations. The proxying generates a capability (in the systems sense), since it is unforgeable: the special separator cannot be cast to other interfaces at runtime.

Continuing to further refer primarily to FIG. 5, proxy entities can simplify development by allowing object 124 (FIG. 4) the flexibility of combining both event-driven and regular cross-entity method invocations 130 (FIG. 3B) within the same class 113 (FIG. 1B). They are interface-based, so they do not interfere with the object hierarchy. And, they allow for a capability-like isolation of functionality, which is useful in larger simulators. Finally, the internal mechanisms used for both event dispatch and delivery of events are different, but there is no visible difference from regular entities 128 (FIG. 4) at the syntactic level nor any degradation in performance.

Figure 6:
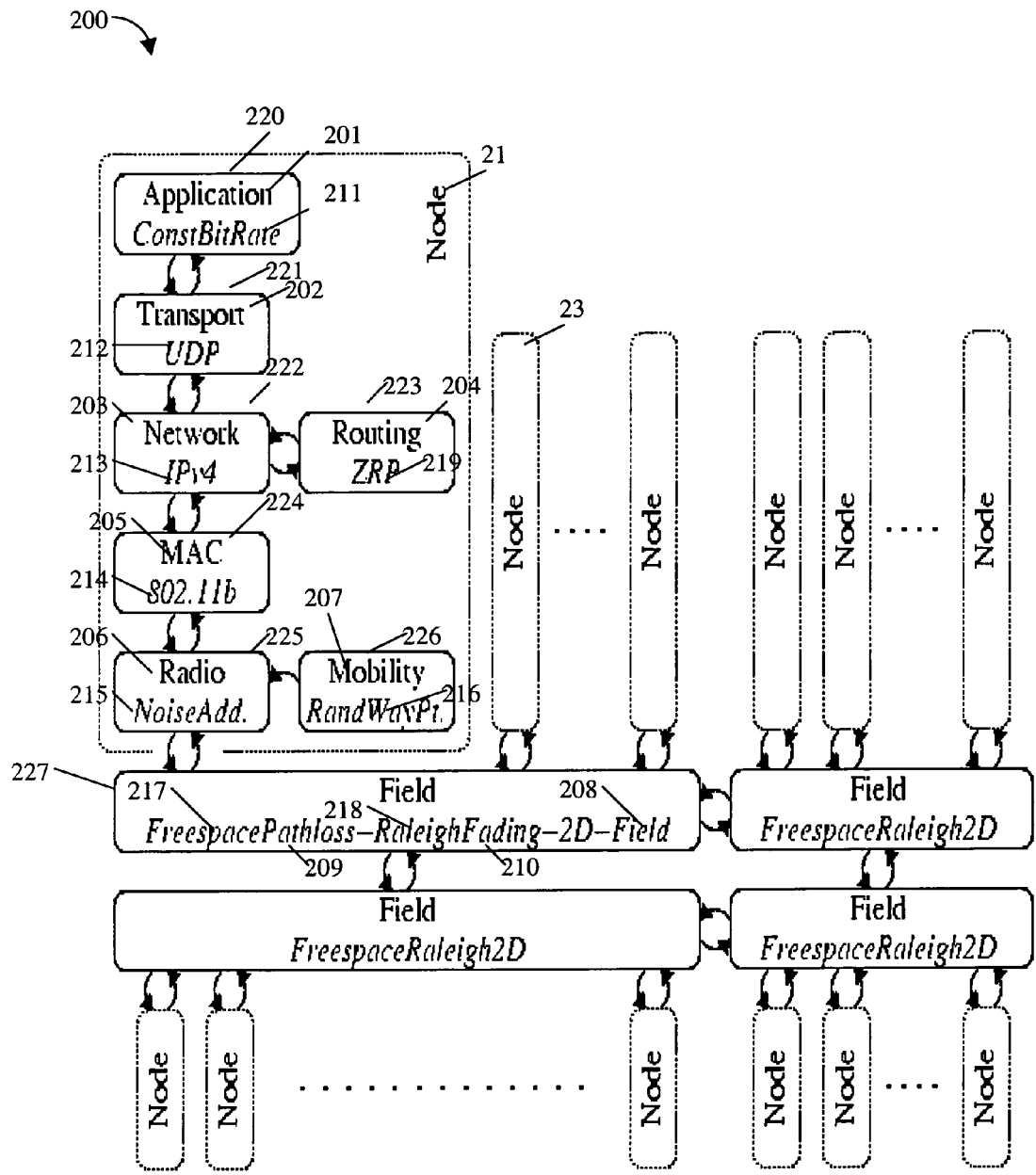
FIG. 6 is a schematic block diagram of an illustrative embodiment of the present invention.

Referring now primarily to FIG. 6, illustrative simulator 200 includes event-driven components that can be configured and composed to form a meaningful wireless network simulation atop the framework of system 100 (FIG. 1B). Different classes of components 201-210 are shown in a typical arrangement together with specific instances of component types 211-219. Analytically quantifying the performance and complex behavior of even simple protocols on a large scale is often imprecise, and performing actual experiments is onerous. Components 201-210 implement different types of applications; networking, routing and media access protocols; radio transmission, reception and noise models; signal propagation and fading models; and node mobility models. Every simulator component 201-210 is encapsulated as an entity 220-227. Each component 201-210 stores it own local state and interacts with other components 201-210 via exposed event-based interfaces. Simulator 200 contains components for constructing a node stack, as well components for a variety of mobility models and field configurations. This pattern simplifies simulation development by reducing the problem to creating relatively small, event-driven components. It also explicitly partitions the simulation state and the degree of inter-dependence between components 201-210. It also allows components to be readily interchanged with suitable alternate implementations of the common interfaces and for each simulated node to be independently configured. Finally, it also confines the simulation communication pattern. For example, Application component 201 or Routing component 204 of different nodes cannot communicate directly. They can only pass messages along their own node stacks. Consequently, the elements of the simulated node stack above the Radio component 206 layer become trivially parallelizable, and may be distributed with low synchronization cost. In contrast, different Radios do contend (in simulation time 163 (FIG. 2)) over the shared Field entity 227 and raise the synchronization cost of a concurrent simulation execution. To reduce this contention in a distributed simulation, the simulated field may be partitioned into non-overlapping, cooperating Field entities along a grid.

With further reference primarily to FIG. 6, for efficiency, design of communication among co-located entities 220-227 should incur no serialization, copy, or context-switching cost. If JAVA® is the chosen conventional language, for example, objects 124 (FIG. 3A) contained within entities 220-227 are passed along by reference via kernel 108 (FIG. 1B). In simulator 200, simulated network packets are a chain of nested objects 124 that mimic the chain of packet headers added by a network stack. Moreover, since the packets are designed to be timeless objects 138 (FIG. 4), a single broadcasted packet can be safely shared among all the receiving nodes and the same object 124 sent by Application component 201 on first node 21 will be received at the Application entity of second node 23. Similarly, if Transmission Control Protocol (TCP) is used in the node stack, then the same object 124 can be referenced in the TCP retransmit buffer of first node 21. This design can conserve memory, which in turn allows for the simulation of larger network models. The partitioning of node functionality into individual, fine-gained illustrative entities 220-227 provides an additional degree of flexibility for distributed simulations. The illustrative entities 220-227 can be vertically aggregated, which allows communication along a network stack within a node to occur more efficiently. Illustrative entities 220-227 can also be horizontally aggregated to allow communication across nodes to occur more efficiently. In simulator 200, this reconfiguration can happen without any change to the illustrative entities 220-227 themselves. The distribution of illustrative entities 220-227 across physical hosts running the simulation can be changed dynamically in response to simulation communication patterns and it does not need to be homogeneous. Simulator 200 can execute unmodified network applications written in JAVA® over simulated network, thus allowing for the inclusion of existing JAVA®-based software, such as web servers, peer-to-peer applications and application-level multicast protocols. These applications do not merely send packets to the simulator from other processes. They operate in simulation time 163 (FIG. 2) within the same system 100 process space, allowing for greater scalability. As another example, a similar transformation could be performed on JAVA®-based database engines or file-system applications to model disk accesses. This integration is achieved via a special AppJava application entity designed to be a harness for JAVA® applications. This harness inserts an additional rewriting phase into kernel 108, which substitutes simulator 200 socket implementations for any JAVA® counterparts that occur within the application. These simulation 200 sockets have identical semantics, but send packets through the simulated network. Specifically, the input and output methods are still blocking operations (see FIG. 8). To support these blocking semantics, simulator 200 automatically modifies the necessary application code into continuation-passing style, which allows the application to operate within the event-oriented simulation time environment.

Figure 7A:
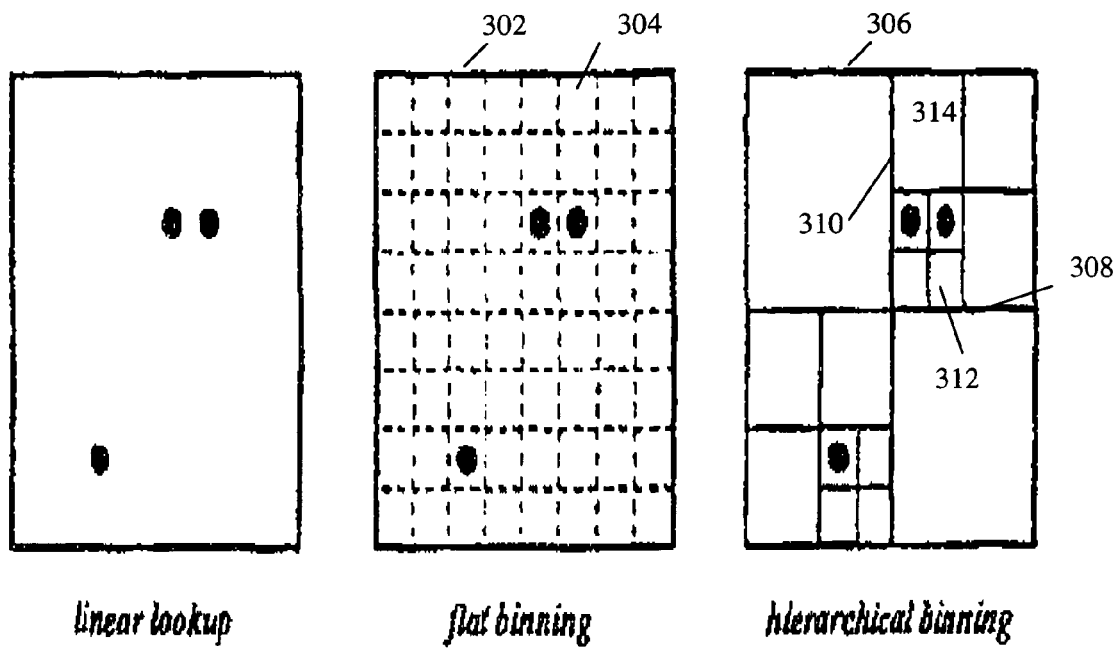
FIG. 7A is schematic block diagram demonstrating the concepts of linear lookup, flat binning and hierarchical binning of an illustrative simulator that is built using the system of the present invention.

Referring now primarily to FIGS. 6 and 7A, modeling signal propagation within the wireless network is an application-level issue, unrelated to the performance of system 100 (FIG. 1B), but doing so efficiently is essential for scalable wireless simulation. When a simulated radio entity transmits a signal, Field component 208 (FIG. 6) delivers that signal to all radios that could be affected, after considering fading component 210 (FIG. 6), gain, and pathloss component 209 (FIG. 6). Some small subset of the radios on the field will be within reception range and a few more radios will be affected by the interference above some sensitivity threshold. The remaining majority of the radios will not be tangibly affected by the transmission. Simulator 200 (FIG. 6) has been implemented with a naive signal propagation algorithm, which uses a slow, O(n), linear search through all the radios to determine the node set within the reception neighborhood of the transmitter, as well as an improved grid-based algorithm (See V. Naoumov and T. Gross, Simulation of large ad hoc networks, *Proceedings of Workshop on Modeling analysis and simulation of wireless and mobile systems*, pages 50-57, ACM Press 2003, hereby incorporated by reference) based on hierarchical binning, the spatial partitioning imposed by each of these data structures being depicted in FIG. 7A. In the grid-based or flat binning approach, first field 302 is sub-divided into a grid of first node bins 304 (FIG. 7A). A node location update requires constant time, since first node bins 304 divide the field in a regular manner. The neighborhood search is then performed by scanning first node bins 304 within a given distance from the signal source. While this operation is also of constant time, given a sufficiently fine grid, the constant is sensitive to the chosen bin size. Bin sizes that are too large will capture too many nodes and thus not serve their search-pruning purpose; bin sizes that are too small will require the scanning of many empty bins, especially at lower node densities. A reasonable bin size is one that captures a small number of nodes per first node bin 304. Thus, the bin size is a function of the local radio density and the signal propagation radius. However, these parameters may change in different parts of the field, from radio to radio, and even as a function of time, for example, as in the case of power-controlled transmissions.

Continuing to refer primarily to FIG. 7A, in the improved hierarchical binning approach, rather than a flat sub-division, second field 306 is recursively divided along both the x-axis 308 and y-axis 310. Second node bin 312 and third node bin 314 are the leaves of this balanced, spatial decomposition tree, which is of height equal to the number of divisions, or $$\log_4\left(\frac{fieldsize}{binsize}\right).$$

The structure is similar to a quad-tree, except that the division points are not the nodes themselves, but rather fixed coordinates. Note that the height of the tree changes only logarithmically with changes in the bin or field size. Furthermore, since nodes move only a short distance between updates, the expected amortized height of the common parent of the two affected node bins is O(l). This, of course, is under the assumption of a reasonable node mobility that keeps the nodes uniformly distributed. Thus, the amortized cost of updating a node location is constant, including the maintenance of inner node counts. When scanning for node neighbors, empty bins can be pruned upon spatial descent. Thus, the set of receiving radios can be computed in time proportional to the number of receiving radios. Since, at a minimum, it will be necessary to simulate delivery of the signal at each simulated radio, the algorithm is asymptotically as efficient as scanning a cached result, even assuming perfect caching. But, the memory overhead of hierarchical binning is minimal. Asymptotically, it amounts to $$\lim_{n\to\infty} \sum_{i=1}^{\log_4 n} \frac{n}{4^i} = \frac{n}{3}.$$

Figure 7B:
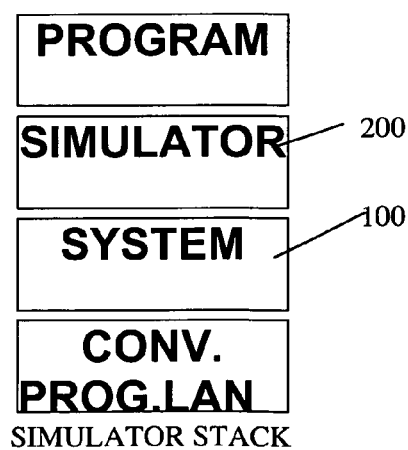
FIG. 7B is a schematic block diagram of the "protocol" stack of the illustrative simulator.

The memory overhead for function caching is also O(n), but with a much larger constant. Furthermore, unlike the cases of flat binning or function caching, the memory accesses for hierarchical binning are tree structured and thus exhibit better locality. With reference to FIG. 7B, a hierarchy is shown that depicts a stack relationship among a computer program, which could be built upon simulator 200 (FIG. 6), which could be built within the framework of system 100 (FIG. 1B), which could be built and executed using a chosen conventional language and its associated compiler 102 (FIG. 1B) and virtual machine 104 (FIG. 1B).

Figure 9:
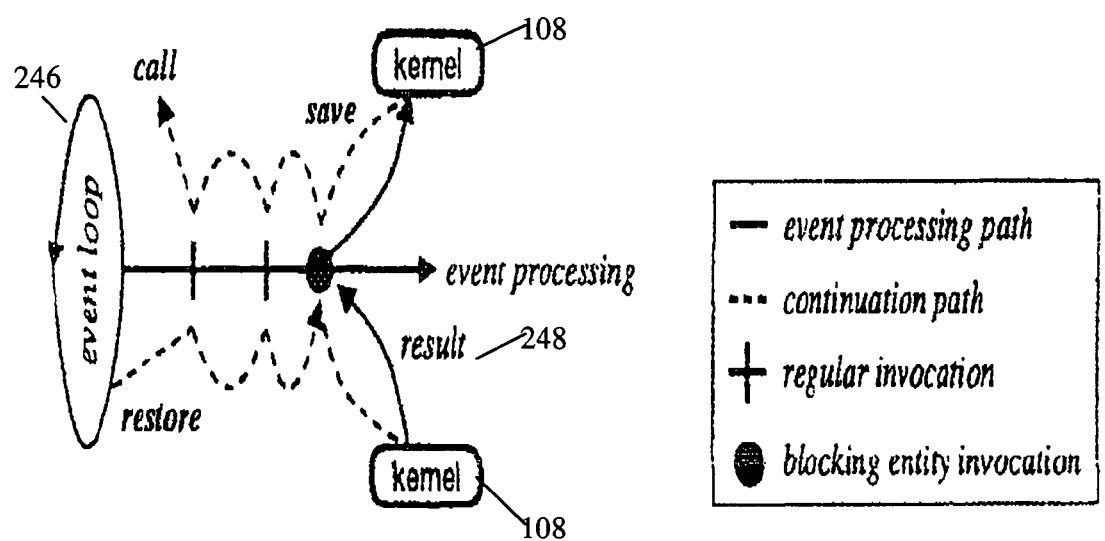
FIG. 9 is a schematic block diagram of event loop processing of the present invention.
Figure 10:
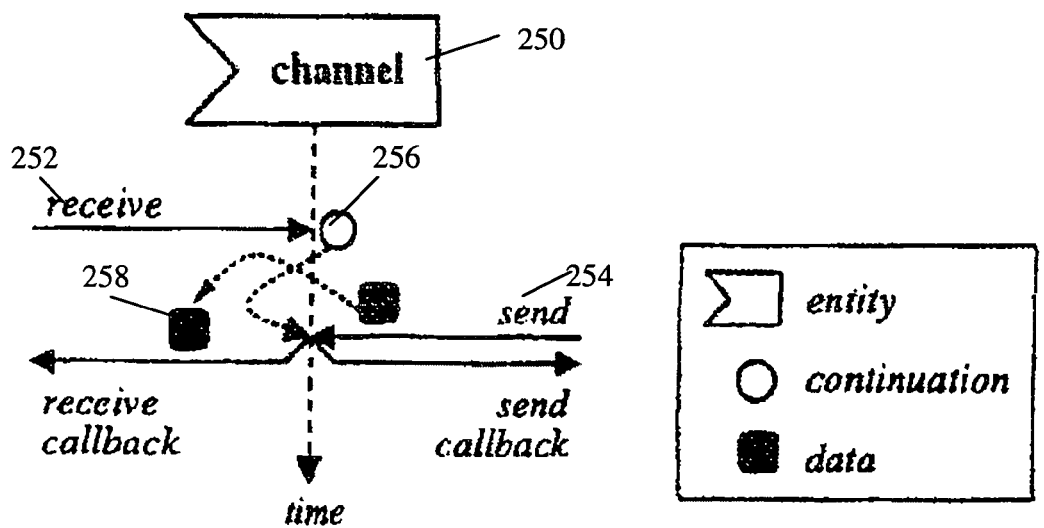
FIG. 10 is a schematic block diagram of creating simulated sockets created with blocking semantics.

With respect to blocking events, and referring primarily to FIGS. 8-10, modeling simulation processes requires that they be written as event-driven state machines. While many entities 128 (FIG. 8), such as network protocols or routing algorithms, naturally take this event-oriented form, other kinds of entities 128 do not For example, an entity 128 that models a file transfer is more readily encoded as a process than as a sequence of events. Specifically, a tight loop can be chosen to surround a blocking_send routine rather than to dispatch send_begin events to some transport entity, which will eventually dispatch matching send_complete events in return. In order to execute programs that make use of system calls with blocking semantics, blocking invocation semantics and simulation time continuations can be implemented within system 100 (FIG. 1B). In order to invoke an entity method with continuation, a given entity method can be declared to be a blocking event as shown in non-blocking event structure 230 (FIG. 8) and blocking event structure 232 (FIG. 8). Blocking and non-blocking methods can co-exist within the same entity 128. Syntactically, an entity method is blocking, if and only if it declares that it throws a Continuation exception. This exception is not actually thrown and need not be explicitly handled by a source entity 134 (FIG. 8). It acts merely as a tag to rewriter 106 (FIG. 1B). The semantics of a blocking cross-entity method invocation 130 (FIG. 3B) calls for saving the call-stack of source entity 134 and attaching it to an outgoing event. When the call event is complete, system 100 notices that it has source entity 134 information, so it dispatches callback event 234 (FIG. 8) to source entity 134, with its continuation information 236 (FIG. 8). Thus, when callback event 234 is eventually dequeued, the state 238 (FIG. 8) is restored and the execution continues right after the point of the blocking entity method invocation. In the meantime, however, the local simulation time will have progressed to the simulation time at which the calling event 240 (FIG. 8) was completed, and other events may have been processed against the source entity 134.

Continuing to refer primarily to FIGS. 8-10, this approach allows blocking and non-blocking entity methods to co-exist, which allows a combination of event-oriented and process-oriented simulation. Methods can arbitrarily be tagged as blocking, and the basic event structures can be extended to store the call information 242 (FIG. 8) and callback information 244 (FIG. 8). However, there is no notion of an explicit process, nor even a logical one. Unlike process-oriented simulation runtimes, which must pre-allocate fixed-size stacks for each real or logical process, system 100 (FIG. 1B) stacks can be variably-sized and allocated on demand. The stacks can be allocated at the point of the blocking entity invocation, and they exist on the heap along with the event structure that contains it. This can reduce memory consumption. Moreover, as with threading, multiple continuations can exist simultaneously for a single entity. Finally, system context-switch is not required. The concurrency occurs only in simulation time 163 (FIG. 2), and the underlying events may be executed sequentially within a single thread of control.

Continuing to refer primarily to FIGS. 8-10, in the illustrative embodiment, saving and restoring a call-stack for continuation calls for a network socket operation to be rewritten into a blocking method invocation, causes the application to be "frozen" until the network packet is delivered by the simulation program. Since a call-stack is not generally available in a conventional language such as JAVA®, parts of the original simulation program can be converted into a continuation-passing style. To determine which parts of the simulation program need to be converted, rewriter 106 (FIG. 1B) can incrementally produce a call-graph of the simulation program at runtime as it is loaded and can use the blocking method tags to determine continuable methods, i.e. those methods that could exist on a call stack at the point of a blocking entity method invocation. Or, more precisely, a continuable method is defined recursively as any method that contains an cross-entity method invocation 130 (FIG. 3B), whose target is a blocking method; or a regular object method invocation 126 (FIG. 3A), whose target is a continuable method. Note that the continuable property does not spread recursively to the entire program, since the recursive element of the continuable definition does not cross entity boundaries. Each method within the continuable set undergoes a basic continuation passing style conversion. The method is scanned for continuation points and each one is assigned a program location number. An intra-procedural data-flow analysis is performed to determine the execution frame and a custom class is generated to store the method execution state. These custom classes, containing properly typed fields for each of the local variables and stack slots in the frame, can be linked together to form a preserved stack. Saving and restoration code can be inserted for each continuation point. The saving code marshals the stack and locals into the custom frame object and pushes the custom frame object onto the event continuation stack via kernel 108 (FIG. 1B). The restoration code does the opposite and then jumps right back to the point of the blocking invocation. These actions should be done in a type-safe manner, which can require special consideration not only for the primitive types, but also for arrays and null-type values.

Referring now primarily to FIG. 9, kernel 108 (FIG. 1B) can function as a continuation trampoline. When kernel 108 receives a request to perform a call with continuation, it can register the call information, switch to save mode, and return to the caller. The stack can then unwind, and can eventually return to event loop 246, at which point the call event can be dispatched with the continuation attached. When the call event is received, it can be processed, and a callback event can be dispatched in return with both the continuation and result 248 attached. Upon receiving this callback event, kernel 108 can switch to restore mode and invoke the appropriate method. The stack can then wind up to its prior state, and kernel 108 can receive a request for a continuation call yet again. This time, kernel 108 can return the result of the call event and allow the event processing to continue from where it left off. Extensions to the conventional libraries, such as, for example, the JAVA® library, and virtual machine 104 (FIG. 1B) that exposes the stack in a type-safe manner could eliminate a possible performance gap between non-blocking and blocking events.

Referring now primarily to FIG. 10, in order to mimic a boundary between a user-level network application and an in-kernel network stack, channel 250 can be constructed from, for example, Hoare's Communicating Sequential Processes language (CSP). Channel 250 can be created via a createChannel system call, and channel 250 can support both CSP semantics as well as non-blocking sends 254 and receives 252. Channel 250 can be used, for example, within an implementation of TCP sockets in order to block a program such as, for example, a JAVA® application, when it calls receive 252, and to send data 258 back to the program when a packet arrives. Channel 250 can block on the first receive 252 (or send 254) call and can store continuation 256. When the matching send 254 (or receive 252) arrives, then data 258 is transferred across channel 250 and control returns to both callers. In other words, two simulation events are scheduled with the appropriate continuations 256. Note that other synchronization primitives, such as locks, semaphores, barriers, monitors, and First-In-First-Out queues, can readily be built using such channels 250. These primitives can also be implemented directly within kernel 108 (FIG. 1B).

Continuing to refer primarily to FIG. 10, system 100 (FIG. 1B) can support inter-simulation concurrency. Any number of system 100 engines can be started on separate machines, each capable of accepting programs from a central job queue, where clients post programs. As each job is processed on the next available server, the corresponding client will service remote class loading requests and receive redirected output and simulation logs. However, when kernel 108 (FIG. 1B) is divided into multiple threads of execution (controllers), parallel execution is possible. Each controller can own and process the events of a subset of the entities 128 (FIG. 3A) in system 100, and controllers can synchronize with one another in order to bound their otherwise independent forward progress. In an embodiment in which system 100 supports entity rollback, simulation time synchronization protocols among the various controllers need not be conservative. State checkpoints can be automatically taken through object cloning. Alternatively, efficient undo operators can be statically generated. In any case, entity 128 state changes can be dynamically intercepted either at the level of complete entities 128, individual objects 124 (FIG. 3A), or even individual fields within object 124. These state changes can be logged for possible undo, allowing kernel 108 to transparently perform speculative execution of the program. Controllers may also be distributed in order to run programs across a cluster of machines. When there is support in the chosen conventional language for remote method invocation combined with automatic object serialization, location transparency among the distributed controllers is possible. Separators 136 (FIG. 3B) can allow entities 128 to be dynamically moved among controllers in system 100, for balancing load or for minimizing invocation latency and network bandwidth, while the program is running. The automatic insertion of separators 136 between entities 128 can provide a single system image abstraction of a cluster. System 100 can allow actions to be executed before and after each event on per entity 128 basis, which allows for orthogonal simulation inspection and logging, modifying simulation state 142 while it is in progress and general-purpose debugging. It is also useful for application-level functionality, such as efficiently implementing node mobility.

Figure 11:
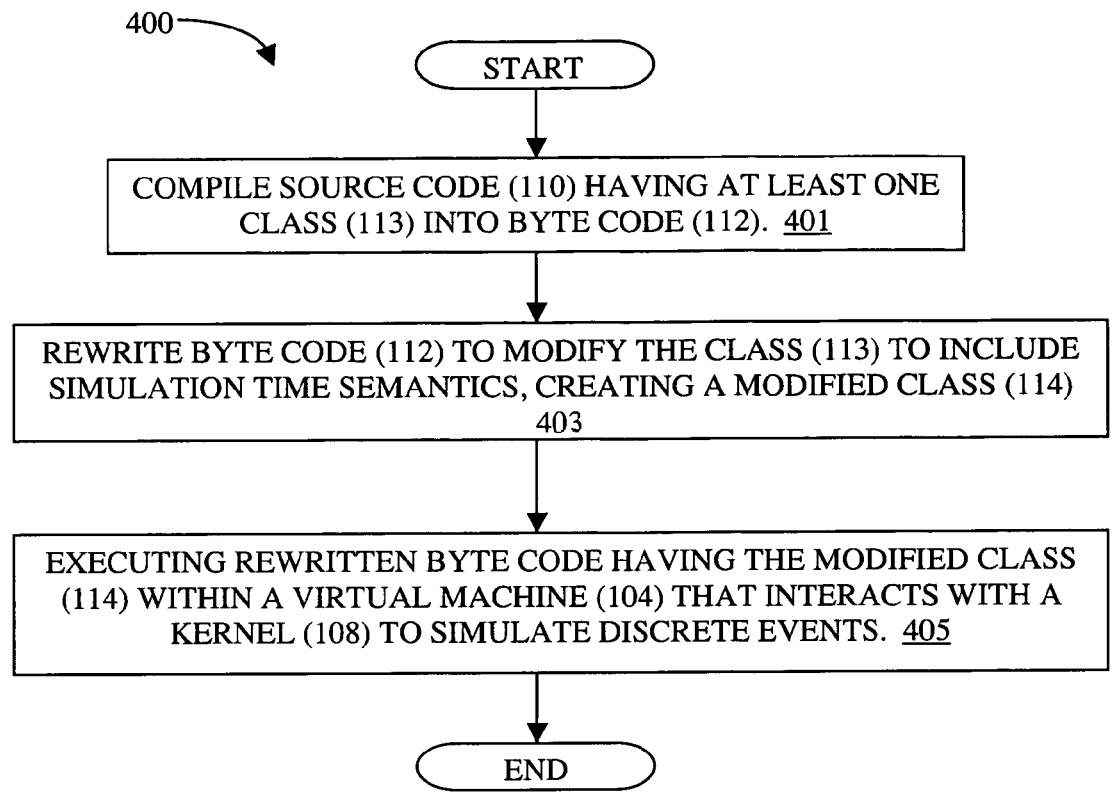
FIG. 11 is a flowchart of the method for simulating discrete events of the present invention.

Referring primarily to FIG. 11, operationally, simulation processing in system 100 (FIG. 1B) can begin via an anonymous bootstrap entity with a single scheduled message which invokes the main( ) method of the given entry point in class at time $t_0$. System 100 can then process events in simulation temporal order until there are no more events to process, or until a pre-determined time expires, whichever comes first. This general approach supports the sequential execution of any discrete event simulation. System 100 may transparently exploit parallelism or process messages optimistically, as discussed below. Method 400 (FIG. 11), that can provide a process by which discrete event simulation can be performed, can include, but is not limited to, the step of compiling source code 110 (FIG. 1B) having at least one class 113 (FIG. 1B) into byte code 112 (FIG. 1B), at least one class 113 having at least one object 124 (FIG. 3A) (method step 401, FIG. 11). Method 400 can also include the steps of rewriting byte code 112 to modify at least one class 113 to include simulation time semantics, forming at least one modified class 114 (FIG. 1B) (method step 403, FIG. 11), and executing byte code 112 having at least one modified class 114 within a virtual machine 104 (FIG. 1B) that interacts with a kernel 108 (FIG. 1B) to simulate discrete events (method step 405, FIG. 11). Within method 400 simulation time semantics includes conventional language compiler 102 semantics, conventional language virtual machine 104 semantics, and rewriter 106 (FIG. 1B) and kernel 108 semantics that can manage the advance of simulation time 163 (FIG. 2) based on the execution progress of byte code 112. Method 400 can optionally include the steps of containing a simulation state 142 (FIG. 5) in at least one object 124, containing at least one object 124 in an entity 128 that has at least one entity method, and replacing references to at least one object 124 with references to entity 128. Method 400 can also optionally include the steps of replacing references to entity 128 with separators 136 (FIG. 3B), and executing at least one entity method in the simulation time 163.

Figure 12:
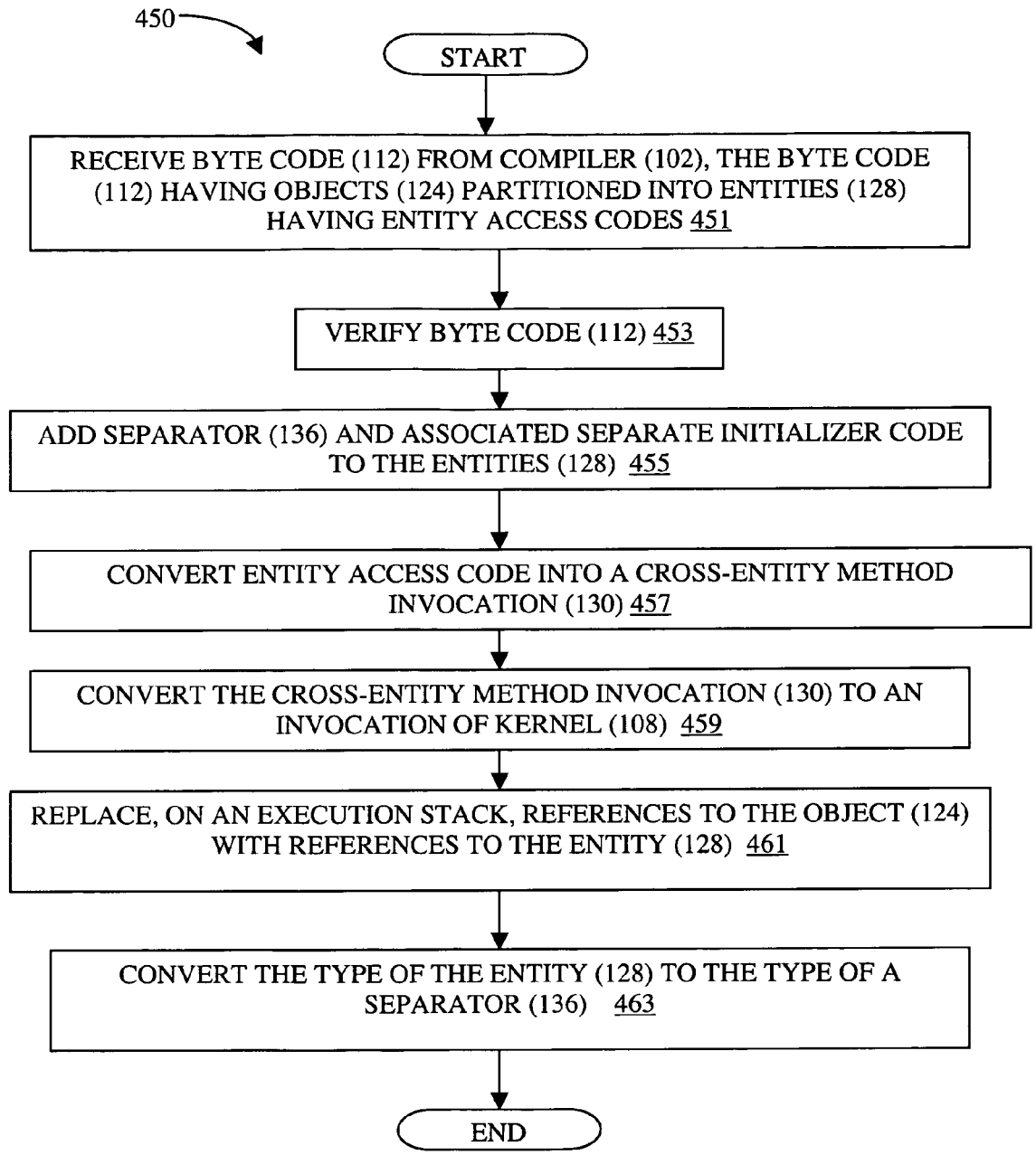
FIG. 12 is a flowchart of the method for modifying byte code to create a discrete event simulation.

Referring now primarily to FIG. 12, method 450 for modifying byte code 112 (FIG. 1B) to create a discrete event simulation can include, but is not limited to, the step of receiving byte code 112 from a compiler 102 (FIG. 1B), where byte code 112 has at least one object 124 (FIG. 3A) partitioned into at least one entity 128 (FIG. 3A), where at least one entity 128 is associated with an entity access code (method step 451, FIG. 12). Method 450 can further include the steps of verifying byte code 112 (method step 453, FIG. 12), adding at least one separator 136 (FIG. 3B) and separator initializer code associated with the at least one separator 136 to at least one entity 128 (method step 455, FIG. 12), converting the entity access code into at least one cross-entity method invocation 130 (FIG. 3B) (method step 457, FIG. 12), converting at least one cross-entity method invocation 130 to at least one invocation of kernel 108 (FIG. 1B) (method step 459, FIG. 12), replacing, on an execution stack, references to at least one object 124 with references to at least one entity 128 (method step 461, FIG. 12), and converting a type of at least one entity 128 to the type of at least one separator 136 (method step 463, FIG. 12). Verifying byte code 112 in method 450 can include the steps of: ensuring that simulation state 142 of at least one entity 128 is restricted to its instance, and providing for cross-method method invocation 130 without continuation. Converting the at least one cross-method method invocation 130 to the at least one invocation of kernel 108 in method 450 can include the steps of retrieving simulation time 163 (FIG. 2) from kernel 108, retrieving entity identifier 165 (FIG. 2) from kernel 108, and identifying a target entity 132 (FIG. 2) from at least one separator 136.

Although the invention has been described with respect to various embodiments, it should be realized this invention is also capable of a wide variety of further and other embodiments within the spirit of the invention.

It is claimed:

1. A method for simulation comprising the steps of:
   compiling source code of the simulation having at least one class into byte code, the at least one class having at least one simulation object;
   converting the byte code to modify the at least one class to include simulation time semantics, said step of converting capable of creating at least one modified class;
   accessing a simulation kernel by the converted byte code to determine a simulation time, and
   executing the converted byte code within a virtual machine that interacts with the simulation kernel, said step of executing utilizing the simulation time and capable of performing the simulation;
   wherein the simulation time semantics includes:
   language compiler semantics;
   language virtual machine semantics; and
   rewriter semantics coupled with simulation kernel semantics capable of managing advance of the simulation time based on the execution progress of the converted byte code.

2. The method as in claim 1 further comprising the steps of:
   containing a simulation state in the at least one simulation object;
   containing the at least one simulation object in an entity, the entity being associated with executable software;
   replacing references to the at least one simulation object with references to the entity;
   replacing references to the entity with separators; and
   executing the executable software in the simulation time.

3. A method for modifying byte code of a conventional language to embed simulation time semantics directly into the byte code to create a discrete event simulation comprising the steps of:
   receiving the byte code, the byte code having at least one object partitioned into at least one entity, the at least one entity being associated with an entity access code;
   verifying the byte code; and
   modifying the byte code to embed the simulation time semantics to create a discrete event simulation by performing steps including:
   adding at least one separator and separator initializer code to the at least one entity;
   converting the entity access code into at least one cross-entity method invocation;
   converting the at least one cross-entity method invocation to at least one invocation of a simulation kernel that maintains a simulation time according to the simulation time semantics of the at least one entity, said step of converting the at least one cross-entity method invocation to the at least one invocation of the simulation kernel comprising the steps of:
   accessing the simulation time from the simulation kernel;
   accessing an entity identifier from the simulation kernel; and
   identifying a target entity from the at least one separator;
   replacing references to the at least one object with references to the at least one entity; and
   converting a type of the at least one entity to a type of the at least one separator; and
   executing the modified byte code within a virtual machine that interacts with the simulation kernel, said step of executing utilizing the simulation time and capable of performing the simulation.

4. The method of claim 3 wherein said step of verifying the byte code further comprising the steps of:
   ensuring that a simulation state of the at least one entity is restricted to the instance of the at least one entity; and
   providing for the at least one cross-entity method invocation executing without continuation.

5. A system for simulation comprising:
   at least one processor having memory associated therewith, said at least one processor including:
   a rewriter having computer instructions on a computer readable medium that convert byte code to modify at least one class to include simulation time semantics, said conversion creating at least one modified class from said at least one class; and
   a simulation kernel having computer instructions on a computer readable medium to execute the converted byte code within a virtual machine that interacts with said simulation kernel, said execution utilizing a simulation time and capable of performing the simulation,
   wherein the converted byte code accesses said simulation kernel to determine said simulation time; and
   wherein the simulation time semantics includes:
   language compiler semantics;
   language virtual machine semantics; and
   rewriter semantics coupled with simulation kernel semantics capable of managing advance of said simulation time based on the execution progress of the converted byte code.

6. The system as in claim 5 further comprising:
   source code having at least one class; and
   a compiler capable of converting said source code into said byte code.

7. The system as in claim 6 wherein said compiler is a conventional programming language compiler.

8. The system as in claim 7 wherein said virtual machine is associated with said conventional programming language compiler.

9. The system as in claim 6 wherein said simulation kernel is capable of providing said simulation time.

10. The system as in claim 9 wherein said rewriter comprises:
    a verifier capable of verifying that said byte code conforms to said simulation time semantics, said byte code having at least one entity, said at least one entity having at least one object;
    a reference converter capable of adding a separator to said at least one entity, said reference converter capable initializing said separator to said at least one entity;
    an invocation converter capable of converting entity field accesses into cross-entity method invocations and replacing said cross-entity method invocations with invocations to said simulation kernel; and
    a separator handler capable of modifying entity creations in said at least one class to replace a reference to said at least one object with said separator.

11. The system as in claim 10 wherein said rewriter further comprises:
- a type converter capable of converting the type of said at least one entity to the type of said separator and capable of converting static calls written using an Applications Programming Interface (API) associated with said system into equivalent implementations that invoke the functionality of said simulation kernel; and
- a static analyzer capable of identifying and labeling timeless objects and capable of generating code to assist in object checkpointing and remote entity invocation.

12. The system of claim 5 wherein said simulation kernel comprises:
- a time-stamp maintainer capable of providing time-stamps for messages;
- a message queue capable of storing said messages to be transmitted among entities;
- an entity processor capable of scheduling and transmitting said messages having said time-stamps among said entities; and
- a simulation time processor capable of managing said simulation time;
- wherein said simulation kernel is capable of associating said time-stamps with said messages, and wherein said simulation kernel is capable of queuing said messages to said message queue on behalf of said entities, and wherein said simulation kernel is capable of advancing said entities through said simulation time.

13. The system of claim 12 wherein said simulation kernel further comprises:
- a system maintenance support capable of supporting functions performed by said virtual machine.

14. A system for simulation comprising:
- means for compiling source code of the simulation in a computer processor, said source code having at least one class into byte code, said at least one class having at least one simulation object;
- means for converting in said computer processor said byte code to modify said at least one class to include simulation time semantics, said step of converting creating at least one modified class;
- means for accessing a simulation kernel by the converted byte code to determine a simulation time; and
- means for executing in a computer processor the converted byte code within a virtual machine that interacts with said simulation kernel utilizing said simulation time to perform the simulations;
- wherein said simulation time semantics includes:
  - conventional language compiler semantics;
  - conventional language virtual machine semantics; and
  - rewriter semantics coupled with simulation kernel semantics capable of managing advance of said simulation time based on the execution progress of the converted byte code.

15. The system as in claim 14 further comprising:
- means for containing a simulation state in said at least one object;
- means for containing said at least one object in an entity, said entity having at least one entity method;
- means for replacing references to said at least one object with references to said entity;
- means for replacing references to said entity with references to a separator; and
- means for executing said at least one entity method in said simulation time.

16. A computer node having a computer processor for
- compiling source code of a simulation having at least one class into byte code, said at least one class having at least one simulation object;
- converting said byte code to modify said at least one class to include simulation time semantics, said converting capable of creating at least one modified class;
- accessing a simulation kernel by the converted byte code to determine a simulation time, and
- executing the converted byte code within a virtual machine that interacts with said simulation kernel, said executing utilizing said simulation time and capable of performing said simulation;
- wherein the simulation time semantics includes:
  - language compiler semantics;
  - language virtual machine semantics; and
  - rewriter semantics coupled with simulation kernel semantics capable of managing advance of the simulation time based on the execution progress of the converted byte code.

17. A communications network comprising a computer node having a computer processor for
- compiling source code of a simulation having at least one class into byte code, said at least one class having at least one simulation object;
- converting said byte code to modify said at least one class to include simulation time semantics, said converting capable of creating at least one modified class;
- accessing a simulation kernel by the converted byte code to determine a simulation time, and
- executing the converted byte code within a virtual machine that interacts with said simulation kernel, said executing utilizing said simulation time and capable of performing said simulation;
- wherein the simulation time semantics includes:
  - language compiler semantics;
  - language virtual machine semantics; and
  - rewriter semantics coupled with simulation kernel semantics capable of managing advance of the simulation time based on the execution progress of the converted byte code.

18. A computer readable medium having instructions embodied therein for
- compiling source code of a simulation having at least one class into byte code, said at least one class having at least one simulation object;
- converting said byte code to modify said at least one class to include simulation time semantics, said converting capable of creating at least one modified class;
- accessing a simulation kernel by the converted byte code to determine a simulation time, and
- executing the converted byte code within a virtual machine that interacts with said simulation kernel, said executing utilizing said simulation time and capable of performing said simulation;
- wherein the simulation time semantics includes:
  - language compiler semantics;
  - language virtual machine semantics; and
  - rewriter semantics coupled with simulation kernel semantics capable of managing advance of the simulation time based on the execution progress of the converted byte code.

* * * * *

UNITED STATES PATENT AND TRADEMARK OFFICE
CERTIFICATE OF CORRECTION

PATENT NO. : 7,624,383 B2  Page 1 of 1
APPLICATION NO. : 11/116733
DATED : November 24, 2009
INVENTOR(S) : Rimon Barr et al.

It is certified that error appears in the above-identified patent and that said Letters Patent is hereby corrected as shown below:

In Col. 23, line 47, please change

"perform the simulations;"

to

--perform the simulation;--

Signed and Sealed this

Fifth Day of January, 2010

David J. Kappos
*Director of the United States Patent and Trademark Office*